(12) United States Patent
Fukuchi

(10) Patent No.: US 12,035,565 B2
(45) Date of Patent: Jul. 9, 2024

(54) LIGHT EMITTING DEVICE, IMAGE FORMING DEVICE, PHOTOELECTRIC CONVERSION DEVICE, ELECTRONIC APPARATUS, ILLUMINATION DEVICE, MOVING BODY, AND METHOD OF MANUFACTURING LIGHT EMITTING DEVICE

(71) Applicant: CANON KABUSHIKI KAISHA, Tokyo (JP)

(72) Inventor: Yusuke Fukuchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 110 days.

(21) Appl. No.: 17/956,952

(22) Filed: Sep. 30, 2022

(65) Prior Publication Data
US 2023/0122008 A1 Apr. 20, 2023

(30) Foreign Application Priority Data

Oct. 8, 2021 (JP) ................................. 2021-166498

(51) Int. Cl.
*H04N 23/53* (2023.01)
*G03G 15/04* (2006.01)
(Continued)

(52) U.S. Cl.
CPC ..... *H10K 50/856* (2023.02); *G03G 15/04036* (2013.01); *H04N 23/53* (2023.01);
(Continued)

(58) Field of Classification Search
CPC .... H10K 50/856; H10K 59/123; H10K 71/00; H10K 59/1201; H10K 59/38;
(Continued)

(56) References Cited

U.S. PATENT DOCUMENTS

| 6,771,328 B2 | 8/2004 | Park et al. |
| 2011/0187259 A1* | 8/2011 | Fukuda ................ H10K 59/876 313/114 |

(Continued)

FOREIGN PATENT DOCUMENTS

| JP | 2003-076299 A | 3/2003 |
| JP | 2005-339406 A | 12/2005 |

(Continued)

*Primary Examiner* — Mekonnen D Dagnew
(74) *Attorney, Agent, or Firm* — Venable LLP

(57) ABSTRACT

A light emitting device in which light emitting elements are arranged on a surface of a substrate is provided. Each of the light emitting elements comprises a light emitting layer, a reflective layer arranged between the light emitting layer and the surface, a first electrode arranged between the reflective layer and the light emitting layer, an optical distance adjustment layer arranged between the reflective layer and the first electrode, an insulating layer covering a peripheral portion of the first electrode and arranged, between two light emitting elements adjacent to each other, between the optical distance adjustment layer and the light emitting layer, and a conductive plug extending from the insulating layer to pass through the optical distance adjustment layer and reach a height of an upper surface of the reflective layer while being in electrical contact with the first electrode.

20 Claims, 15 Drawing Sheets

(51) Int. Cl.
*H10K 50/856* (2023.01)
*H10K 59/123* (2023.01)
*H10K 71/00* (2023.01)
H10K 59/12 (2023.01)
H10K 59/38 (2023.01)

(52) U.S. Cl.
CPC ........... *H10K 59/123* (2023.02); *H10K 71/00* (2023.02); *H10K 59/1201* (2023.02); *H10K 59/38* (2023.02)

(58) Field of Classification Search
CPC ................. H10K 59/879; H10K 59/90; H10K 59/80518; H10K 2102/351; H10K 59/876; G03G 15/04036; G03G 15/04063; H04N 23/53
See application file for complete search history.

(56) References Cited

U.S. PATENT DOCUMENTS

| | | | | |
|---|---|---|---|---|
| 2012/0206272 | A1* | 8/2012 | Borlee | G01F 15/10 340/870.17 |
| 2012/0206675 | A1* | 8/2012 | Seo | H05B 33/22 257/E33.072 |
| 2022/0006057 | A1 | 1/2022 | Itonaga | |
| 2024/0074272 | A1* | 2/2024 | Kubota | H10K 59/40 |

FOREIGN PATENT DOCUMENTS

| | | |
|---|---|---|
| JP | 2007-059116 A | 3/2007 |
| WO | 2020/110665 A1 | 6/2020 |

\* cited by examiner

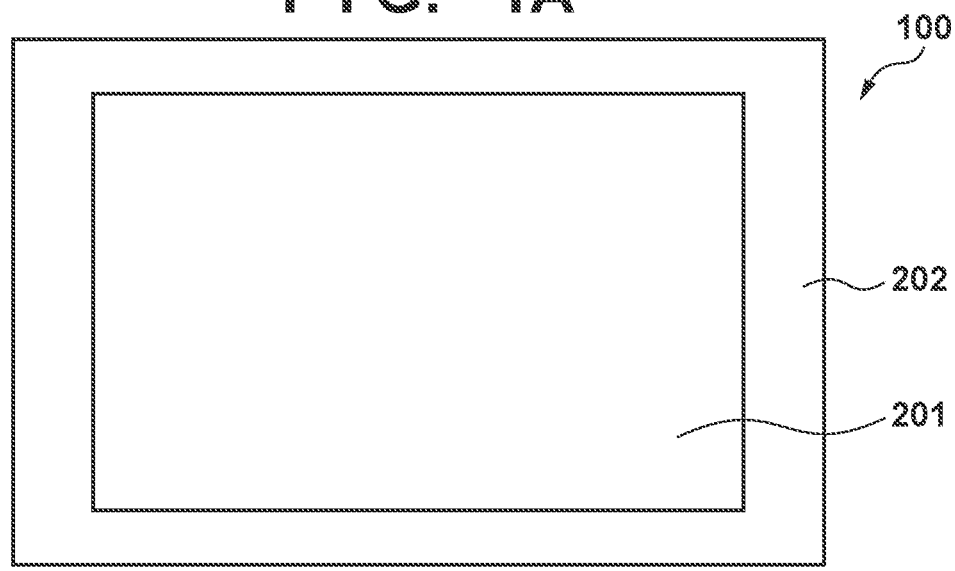
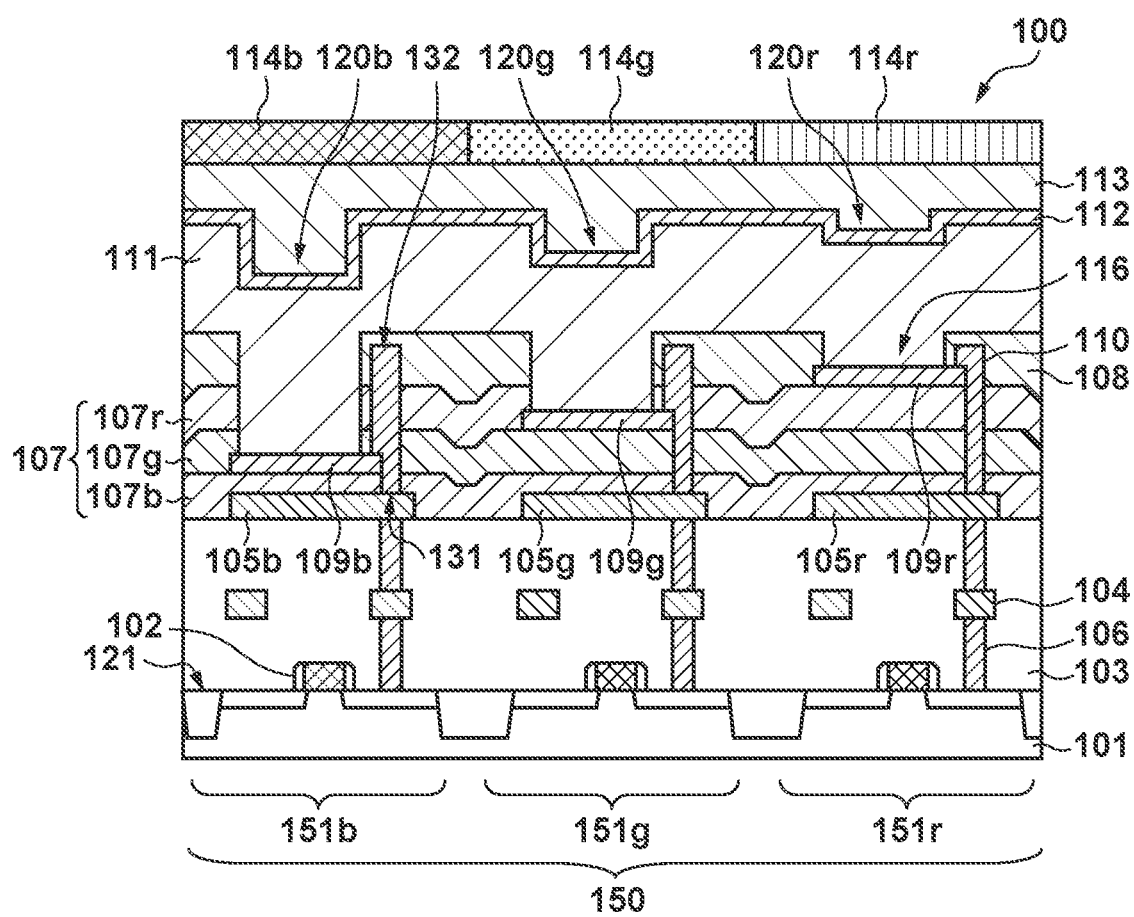

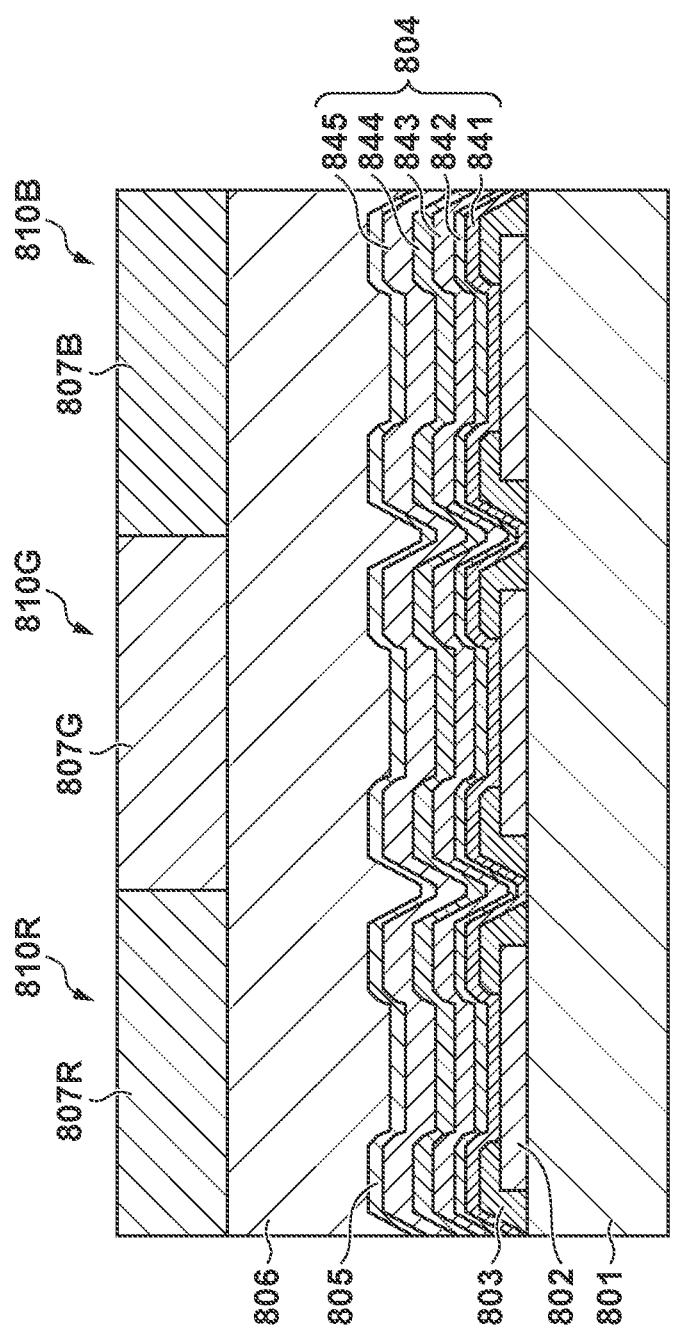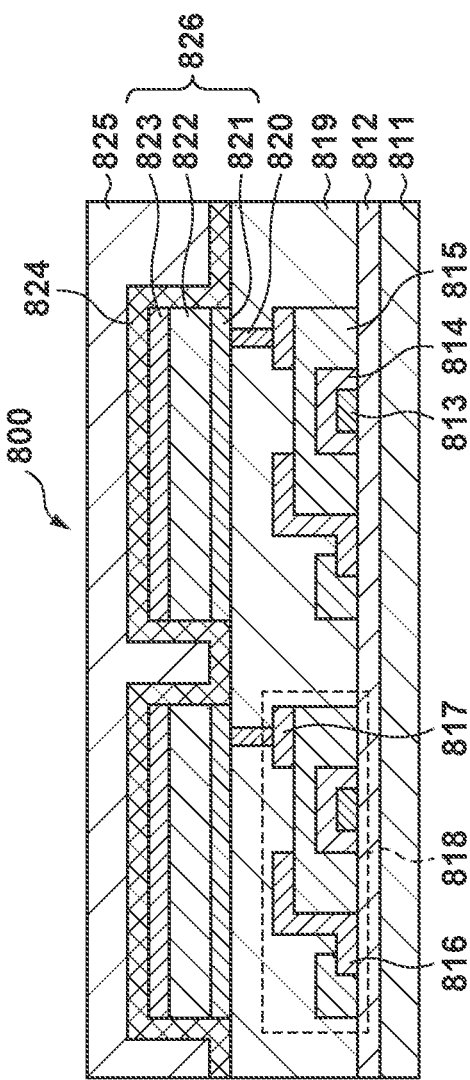

LIGHT EMITTING DEVICE, IMAGE FORMING DEVICE, PHOTOELECTRIC CONVERSION DEVICE, ELECTRONIC APPARATUS, ILLUMINATION DEVICE, MOVING BODY, AND METHOD OF MANUFACTURING LIGHT EMITTING DEVICE

BACKGROUND OF THE INVENTION

Field of the Invention

The present invention relates to a light emitting device, an image forming device, a photoelectric conversion device, an electronic apparatus, an illumination device, a moving body, and a method of manufacturing the light emitting device.

Description of the Related Art

Interest in a light emitting device using a self-light emitting element such as an organic electroluminescence (EL) element has increased. Japanese Patent Laid-Open No. 2007-059116 discloses a light emitting element in which a resonator structure that resonates and extracts emission light of each emission color to improve the light emission efficiency and the color purity is introduced when implementing a full-color display device using a light emitting element.

In the configuration shown in Japanese Patent Laid-Open No. 2007-059116, a transparent conductive film configured to adjust the optical distance between a reflection pattern and a counter electrode using a transparent conductive material is provided with a plug that electrically connects the reflection pattern and the counter electrode. The plug shown in Japanese Patent Laid-Open No. 2007-059116 can be formed by forming a contact hole at a predetermined position of the transparent conductive film, depositing a conductive material such as a metal to fill the contact hole, and polishing an unnecessary conductive material using CMP or the like. In the polishing process, not only the conductive material but also the surface of the transparent conductive film may be polished, and the film thickness of the transparent conductive film may deviate from an appropriate film thickness for implementing the resonator structure.

SUMMARY OF THE INVENTION

Some embodiments of the present invention provide a technique advantageous in improving the light emission efficiency and the color purity of a light emitting device.

According to some embodiments, a light emitting device in which a plurality of light emitting elements are arranged on a main surface of a substrate, wherein each of the plurality of light emitting elements comprises a light emitting layer, a reflective layer arranged between the light emitting layer and the main surface of the substrate and configured to reflect light generated by the light emitting layer, a first electrode arranged between the reflective layer and the light emitting layer, an optical distance adjustment layer arranged between the reflective layer and the first electrode, an insulating layer covering a peripheral edge portion of the first electrode and arranged, between two light emitting elements adjacent to each other in the plurality of light emitting elements, between the optical distance adjustment layer and the light emitting layer, and a conductive plug extending from the insulating layer to pass through the optical distance adjustment layer and reach a height of an upper surface of the reflective layer while being in electrical contact with the first electrode, is provided.

According to some other embodiments, a method of manufacturing a light emitting device in which a plurality of light emitting elements including a light emitting layer are arranged on a substrate, comprising: forming, on the substrate, a reflective layer corresponding to each of the plurality of light emitting elements and configured to reflect light generated by the light emitting layer; forming an optical distance adjustment layer on the reflective layer, and in or on the optical distance adjustment layer, a first electrode corresponding to each of the plurality of light emitting elements and configured to transmit the light generated by the light emitting layer; forming an insulating layer to cover the optical distance adjustment layer and the first electrode; forming a contact hole extending from the insulating layer to pass through the optical distance adjustment layer and reach a height of an upper surface of the reflective layer while exposing a part of the first electrode and forming a conductive plug in the contact hole; and exposing a portion of the first electrode different from the part and forming the light emitting layer in contact with the portion, is provided.

Further features of the present invention will become apparent from the following description of exemplary embodiments (with reference to the attached drawings).

BRIEF DESCRIPTION OF THE DRAWINGS

FIG. 1A is a plan view of a light emitting device according to the embodiment;

FIG. 1B is a sectional view of the light emitting device according to the embodiment;

FIGS. 9A and 9B are sectional views of the light emitting device according to the embodiment;

DESCRIPTION OF THE EMBODIMENTS

Figure 2A:
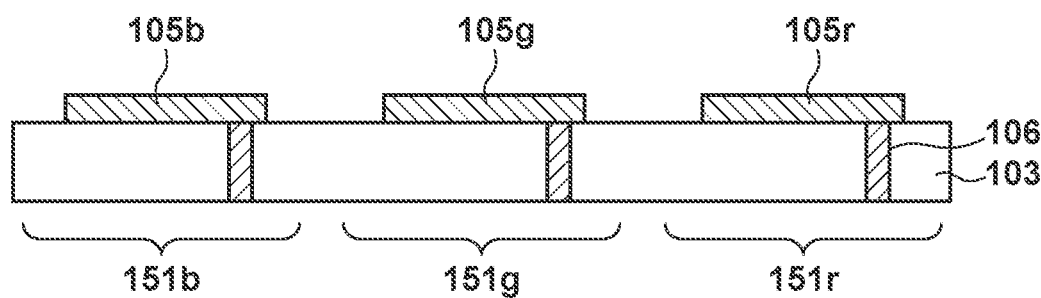
FIGS. 2A to 2C are sectional views showing the manufacturing method of the light emitting device shown in FIGS. 1A and 1B.

Hereinafter, embodiments will be described in detail with reference to the accompanying drawings. It should be noted that the following embodiments are not intended to limit the scope of the appended claims. A plurality of features are described in the embodiments. However, not all the plurality of features are necessarily essential to the present invention, and the plurality of features may arbitrarily be combined. In addition, the same reference numerals denote the same or similar parts in the accompanying drawings, and a repetitive description will be omitted.

A light emitting device according the embodiment of the present disclosure will be described with reference to FIGS. 1A and 1B to 7. FIG. 1A is a plan view of a light emitting device 100 according to this embodiment. The light emitting device 100 can include, for example, a display region 201 in which a plurality of pixels each including a light emitting layer are arranged in a two-dimensional array on a substrate, and a peripheral circuit region 202 that controls the write operation of the pixel signals of an image to be displayed in the display region 201. The light emitting device 100 can display an image (video) such as a still image or a moving image in the display region 201. The image may be a monochrome image or a full-color image.

FIG. 1B is a sectional view of a pixel 150 that is arranged in the display region 201 and includes a light emitting element including a light emitting layer configured to contain a self-light emitting material such as an organic EL material in an organic function layer 111. In this embodiment, a plurality of pixels 150 are formed on a main surface 121 of a substrate 101 in the display region 201. Each of the plurality of pixels 150 includes sub-pixels 151*b*, 151*g*, and 151*r* that emit light of different colors. Hereinafter, to indicate a specific sub-pixel, a suffix is added at the end of a reference numeral, like the sub-pixel 151"*b*", and to indicate an arbitrary sub-pixel, it will simply be expressed as a sub-pixel "151". This also applies to other constituent elements.

A light emitting element 120 is arranged in each of the plurality of sub-pixels 151. Each light emitting element 120 includes a reflective layer 105, an optical distance adjustment layer 107, an insulating layer 108, a transmission electrode 109, the organic function layer 111 including a light emitting layer, a conductive plug 110, and an upper electrode 112. The substrate 101 is a base using a semiconductor material, for example, silicon. An element 102 such as a transistor configured to control light emission (for example, a light amount and a light emission time) in each sub-pixel 151 is arranged on the main surface 121 of the substrate 101. An interlayer dielectric layer 103 is arranged on the element 102 to cover the main surface 121 of the substrate 101 and the element 102. A conductive layer 104 in which a wiring pattern and the like are formed is arranged in the interlayer dielectric layer 103. In the example shown in FIG. 1B, one conductive layer 104 is arranged. However, the present invention is not limited to this, and two or more conductive layers 104 may be arranged in the interlayer dielectric layer 103.

The reflective layer 105 that reflects light generated by the light emitting layer is arranged above the interlayer dielectric layer 103 between the organic function layer 111 including the light emitting layer and the main surface 121 of the substrate 101. As the material of the reflective layer 105, for example, a metal material such as an aluminum alloy can be selected. A conductive plug 106 is arranged between the element 102, for example, the source/drain region of the transistor and the conductive layer 104 and between the conductive layer 104 and the reflective layer 105. The conductive plug 106 electrically connects the element 102, for example, the source/drain region or the gate electrode of the transistor to the conductive layer 104 and the conductive layer 104 to the reflective layer 105. For the conductive plug 106, for example, tungsten (W) including a barrier metal layer such as titanium/titanium nitride (Ti/TiN) is used.

The optical distance adjustment layer 107 can have a stacked structure formed by a plurality of layers 107*b*, 107*g*, and 107*r*. At least a part of the optical distance adjustment layer 107 is arranged between the reflective layer 105 and the transmission electrode 109. Also, a part of the optical distance adjustment layer 107 covers the peripheral edge portion of the transmission electrode 109 in each of the sub-pixels 151*b* and 151*g*. The insulating layer 108 covers the peripheral edge portion of the transmission electrode 109, and is arranged between the optical distance adjustment layer 107 and the organic function layer 111 including the light emitting layer between light emitting elements adjacent to each other in the light emitting elements 120 of the plurality of sub-pixels 151. For the optical distance adjustment layer 107 and the insulating layer 108, for example, a dielectric material such as silicon oxide or silicon nitride can be used.

The transmission electrode 109 (first electrode) is arranged between the reflective layer 105 and the organic function layer 111 including the light emitting layer and transmits the light generated by the light emitting layer. For the transmission electrode 109, for example, a transparent conductive material such as indium tin oxide (ITO) or indium zinc oxide (IZO) is used.

The reflective layer 105 and the transmission electrode 109 are electrically connected via the conductive plug 110. The conductive plug 110 extends from the insulating layer 108 to pass through the optical distance adjustment layer 107 and reach the reflective layer 105 while being in electrical contact with the transmission electrode 109. The conductive plug 110 includes a surface 131 arranged on the side of the reflective layer 105 to be in contact with the reflective layer 105, and a surface 132 arranged in the insulating layer 108, and extends in a direction orthogonal to the main surface 121 of the substrate 101 to connect the surfaces 131 and 132. Also, in an orthogonal projection to the main surface 121 of the substrate 101, the surface 131 of the conductive plug 110 overlaps the surface 132. The conductive plug 110 has a shape that extends from the surface 132 to the surface 131 through the insulating layer 108 and the optical distance adjustment layer 107, such that a part reaches the transmission electrode 109, and another part reaches the reflective layer 105. The conductive plug 110 has a structure similar to a so-called shared contact structure. If the conductive plug 110 having such a structure is used, two layers formed in advance and having different depths (for example, the transmission electrode 109 and the reflective layer 105) can electrically be connected after formation of the two layers only by forming one through hole. The structure of the conductive plug 110 can be formed using a manufacturing method to be described later.

Parts of the optical distance adjustment layer 107 and the insulating layer 108 arranged on the transmission electrode 109 are etched to bring the transmission electrode 109 into contact with the organic function layer 111 including the light emitting layer to form an opening portion 116. The organic function layer 111 including the light emitting layer containing a self-light emitting material is arranged above the transmission electrode 109 and the insulating layer 108 to cover the transmission electrode 109 and the insulating layer 108. Here, "on" or "above" indicates an upward direction in FIG. 1B, that is, a direction of separating from the main surface 121 of the substrate 101 in the normal direction of the main surface 121. Hence, an expression "the organic function layer 111 is arranged on the upper side of the transmission electrode 109" means that the organic function layer 111 is arranged at a position farther apart from the substrate 101 (main surface 121) than the transmission electrode 109.

The upper electrode 112 (second electrode) is arranged above the organic function layer 111. For the upper electrode 112, a transparent conductive material can be used, like the transmission electrode 109. The transmission electrode 109 and the upper electrode 112 function as an anode and a cathode for the organic function layer 111 to form a light emitting element. As shown in FIG. 1B, the organic function layer 111 and the upper electrode 112 may be shared by the plurality of sub-pixels 151. For example, the organic function layer 111 and the upper electrode 112 may integrally be formed all over the display region 201.

A sealing layer 113 is arranged above the upper electrode 112. For the sealing layer 113, for example, a material such as silicon nitride is used. The sealing layer 113 seals constituent elements such as the element 102 formed on the substrate 101 and the organic function layer 111 and suppresses invasion of outer atmosphere and water.

Color filters 114 are arranged above the sealing layer 113 in correspondence with the light emitting elements 120 of the sub-pixels 151. In this embodiment, the light emitting layer included in the organic function layer 111 emits white light, and the color filters 114 convert the light into colors different from each other in the sub-pixels 151b, 151g, and 151r. In this embodiment, a color filter 114b that transmits blue light is formed in the sub-pixel 151b, a color filter 114g that transmits green light is formed in the sub-pixel 151g, and a color filter 114r that transmits red light is formed in the sub-pixel 151r.

A resonator structure using the optical distance adjustment layer 107 and the manufacturing method of the conductive plug 110 that electrically connects the reflective layer 105 and the transmission electrode 109 will be described next in detail with reference to FIGS. 2A to 4B. In FIGS. 2A to 4B, the constituent elements under (on a side close to the main surface 121 of the substrate 101) the reflective layer 105 may be the same as in FIG. 1B. Hence, some of the constituent elements on the side closer to the substrate 101 than the interlayer dielectric layer 103 are not illustrated.

First, as shown in FIG. 2A, reflective layers 105 that correspond to light emitting elements 120 of a plurality of sub-pixels 151 and reflect light generated by a light emitting layer arranged in an organic function layer 111 are formed on a substrate 101 on which an interlayer dielectric layer 103 is formed. The reflective layers 105 are formed by, for example, depositing an AlCu film using a deposition method such as sputtering and performing a process such as a photolithography process or a dry etching process. Each reflective layer 105 is electrically connected to an element 102 such as the transistor of a corresponding sub-pixel 151 via a conductive plug 106. Thus, each reflective layer can be a conductor.

Figure 2B:
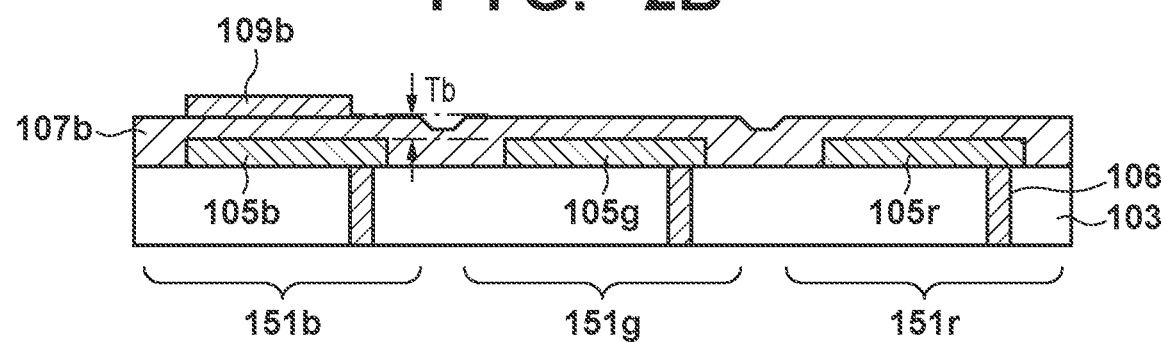

Next, as shown in FIG. 2B, as a layer 107b of an optical distance adjustment layer 107, for example, silicon oxide is deposited on the upper surfaces of the reflective layers 105 using a deposition method such as CVD. Next, on the layer 107b, for example, an ITO film is deposited using a deposition method such as sputtering, and a process such as a photolithography process or a dry etching process is performed, thereby forming a transmission electrode 109b of a light emitting element 120b arranged in a sub-pixel 151b. Here, a film thickness Tb defined by the layer 107b of the optical distance adjustment layer 107 formed between the reflective layer 105 and the transmission electrode 109b is set such that light generated by the light emitting layer included in the organic function layer 111 of the light emitting element 120b arranged in the sub-pixel 151b is reflected and resonated between the layer and the reflective layer 105 to best enhance light having a desired first peak wavelength.

Figure 2C:
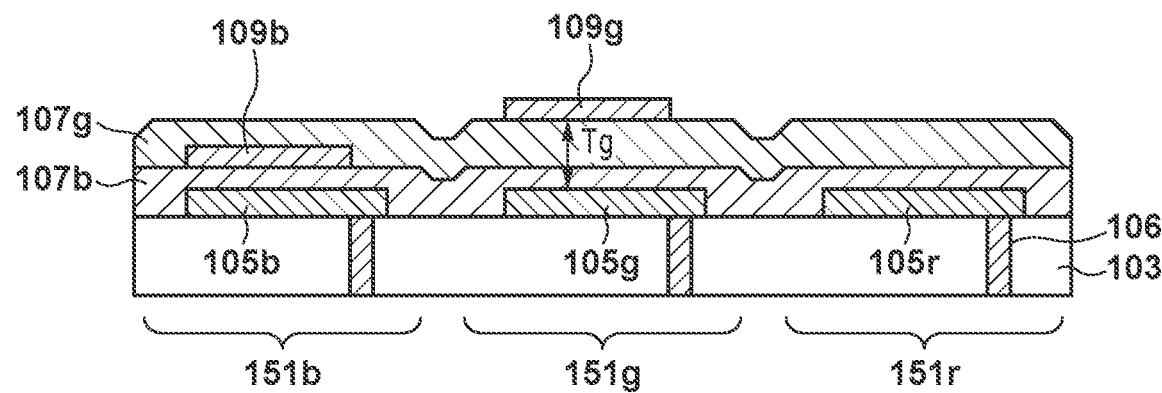

After the transmission electrode 109b is formed, as shown in FIG. 2C, a layer 107g of the optical distance adjustment layer 107 is deposited to cover the transmission electrode 109b and the layer 107b. As the layer 107g, for example, silicon oxide may be deposited using a deposition method such as CVD. Next, on the layer 107g, for example, an ITO film is deposited using a deposition method such as sputtering, and a process such as a photolithography process or a dry etching process is performed, thereby forming a transmission electrode 109g of a light emitting element 120g arranged in a sub-pixel 151g. Here, a film thickness Tg defined by the layers 107b and 107g of the optical distance adjustment layer 107 formed between the reflective layer 105 and the transmission electrode 109g is set such that light generated by the light emitting layer included in the organic function layer 111 of the light emitting element 120g arranged in the sub-pixel 151g is reflected and resonated between the layer and the reflective layer 105 to best enhance light having a desired second peak wavelength different from the above-described first peak wavelength.

Figure 3A:
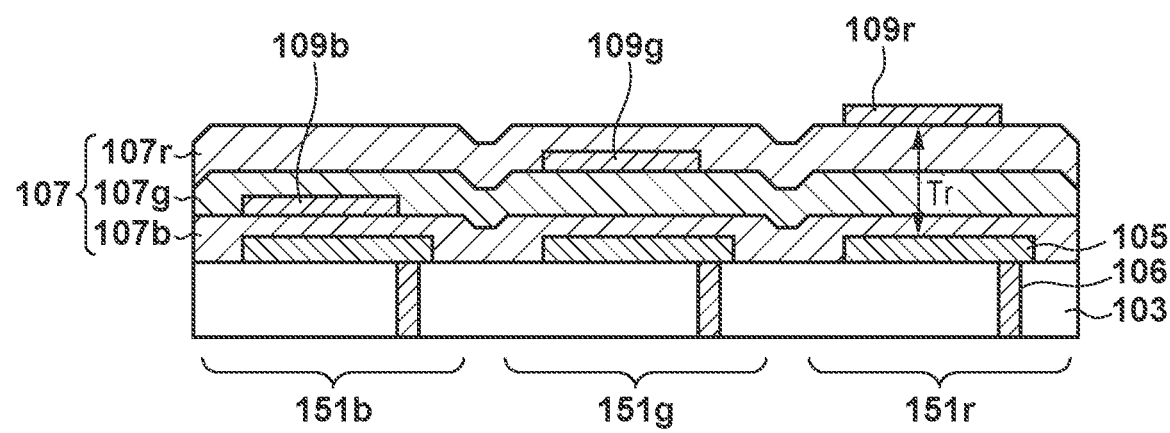
FIGS. 3A and 3B are sectional views showing the manufacturing method of the light emitting device shown in FIGS. 1A and 1B.

After the transmission electrode 109g is formed, as shown in FIG. 3A, a layer 107r of the optical distance adjustment layer 107 is deposited to cover the transmission electrode 109g and the layer 107g. As the layer 107r, for example, silicon oxide may be deposited using a deposition method such as CVD. Next, on the layer 107r, for example, an ITO film is deposited using a deposition method such as sputtering, and a process such as a photolithography process or a dry etching process is performed, thereby forming a transmission electrode 109r of a light emitting element 120r arranged in a sub-pixel 151r. Here, a film thickness Tr defined by the layers 107b, 107g, and 107r of the optical distance adjustment layer 107 formed between the reflective layer 105 and the transmission electrode 109r is set such that light generated by the light emitting layer included in the organic function layer 111 of the light emitting element 120r arranged in the sub-pixel 151r is reflected and resonated between the layer and the reflective layer 105 to best enhance light having a desired third peak wavelength different from the above-described first and second peak wavelengths. With the above-described processes, the optical distance adjustment layer 107 is formed on the reflective layers 105, and the transmission electrodes 109 that correspond to the light emitting elements 120 of the plurality of sub-pixels 151 and transmit light generated by the light emitting layer in the organic function layer 111 are formed in or on the optical distance adjustment layer 107.

Figure 3B:
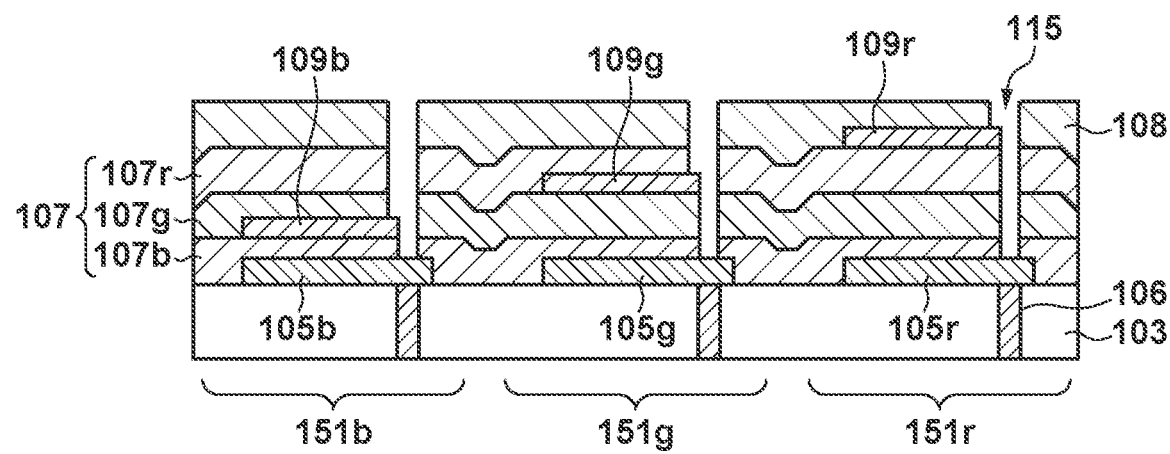

Next, as shown in FIG. 3B, an insulating layer 108 is formed to cover the optical distance adjustment layer 107 and the transmission electrodes 109. As the insulating layer 108, for example, silicon oxide may be deposited using a deposition method such as CVD. The surface (upper surface) of the insulating layer 108 is planarized by planarization processing such as a CMP process.

After the surface of the insulating layer 108 is planarized, a process such as a photolithography process or a dry etching process is performed, thereby forming contact holes 115 each of which extends from the insulating layer 108 to pass through the optical distance adjustment layer 107 and reach the reflective layer 105 while exposing a part of the transmission electrode 109. The contact hole 115 is formed such that the contact hole 115 extends from the upper side of the insulating layer 108 through the insulating layer 108 and the optical distance adjustment layer 107 to reach the transmission electrode 109, and a part of the contact hole 115 reaches the reflective layer 105.

Figure 4A:
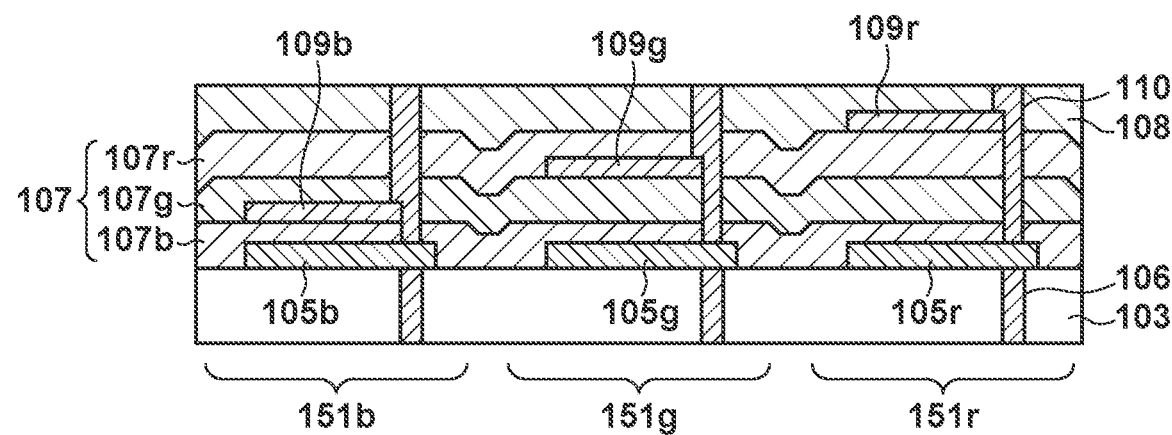
FIGS. 4A and 4B are sectional views showing the manufacturing method of the light emitting device shown in FIGS. 1A and 1B.

After the contact holes 115 are formed, as shown in FIG. 4A, a conductive plug 110 is formed in each contact hole 115. For example, after a Ti/TiN barrier metal layer is formed, a tungsten layer is deposited to fill the contact holes 115. After the contact holes 115 are filled, for example, planarization processing (polishing processing) such as a CMP process is performed, and the conductive material such as the tungsten film deposited on the surface of the insulating layer 108 is polished, thereby forming the conductive plugs 110. By the planarization processing, a part of the surface of the insulating layer 108 can be polished and removed. However, the planarization processing does not affect the optical distance adjustment layer 107 covered by the insulating layer 108, and the film thicknesses (film thicknesses Tb, Tg, and Tr) of the optical distance adjustment layer 107 are maintained.

Figure 4B:
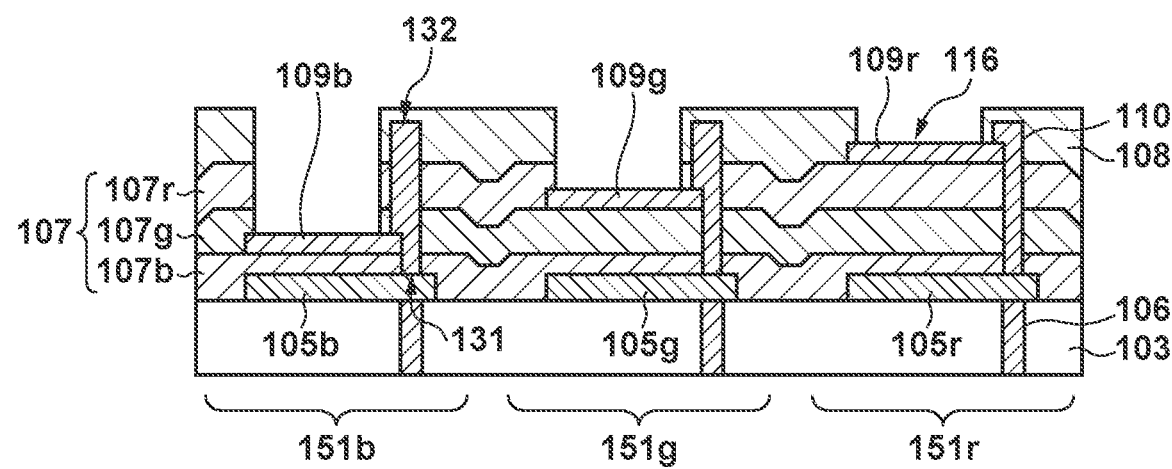

Next, an insulating layer is further formed to cover the conductive plugs 110, thereby burying the conductive plugs 110. The insulating layer covering the conductive plugs 110 may be made of the same material as the insulating layer 108, for example, silicon oxide. For this reason, in FIG. 4B, the insulating layer covering the conductive plugs 110 is integrated with the insulating layer 108. Furthermore, as shown in FIG. 4B, a process such as a photolithography process or a dry etching process is performed, thereby forming opening portions 116 each of which extends through parts of the optical distance adjustment layer 107 and the insulating layer 108 and exposes a portion of the transmission electrode 109 different the part where the contact hole 115 is formed. In the dry etching process, the process is performed under a condition that the etching rate of the insulating layer 108 and the optical distance adjustment layer 107 is much higher than the etching rate of the transmission electrode 109, and the transmission electrode 109 may function as an etching stopper.

With the above processes, resonator structures including the optical distance adjustment layers 107 defined by the film thicknesses Tb, Tg, and Tr are formed in the sub-pixels 151b, 151g, and 151r. That is, the light emitting elements 120 arranged in the plurality of sub-pixels 151 include the light emitting element 120b of the sub-pixel 151b, the light emitting element 120g of the sub-pixel 151g, and the light emitting element 120r of the sub-pixel 151r, whose distances between the reflective layers 105 and the transmission electrodes 109 are different from each other, and the optical distance adjustment layer 107 includes the layers 107b, 107g, and 107r. In the light emitting element 120b of the sub-pixel 151b, the layer 107b of the optical distance adjustment layer 107 is arranged between a reflective layer 105b and the transmission electrode 109b, and the layers 107g and 107r of the optical distance adjustment layer 107 are arranged between the peripheral edge portion of the transmission electrode 109b and the insulating layer 108. Also, in the light emitting element 120g of the sub-pixel 151g, the layers 107b and 107g of the optical distance adjustment layer 107 are arranged between a reflective layer 105g and the transmission electrode 109g, and the layer 107r of the optical distance adjustment layer 107 is arranged between the peripheral edge portion of the transmission electrode 109g and the insulating layer 108. Furthermore, in the light emitting element 120r of the sub-pixel 151r, the layers 107b, 107g, and 107r of the optical distance adjustment layer 107 are arranged between a reflective layer 105r and the transmission electrode 109r.

In addition, the conductive plugs 110 that electrically connect the reflective layers 105 and the transmission electrodes 109 are formed. As described above, the conductive plug 110 extends from the inside of the insulating layer 108 arranged on the optical distance adjustment layer 107 through the transmission electrode 109 and reaches the reflective layer 105. Hence, the surface 132 of each conductive plug 110 can be arranged at a position farther apart from the main surface 121 of the substrate 101 than the transmission electrode 109 of any of the light emitting elements 120 arranged in the plurality of sub-pixels 151. Also, the conductive plug 110 is in contact with a part of the upper surface and the side surface of the peripheral edge portion of the transmission electrode 109.

After the opening portions 116 are formed, vacuum deposition or the like using a vapor deposition mask with an opening of desired patterning is performed, thereby forming the organic function layer 111 including a light emitting layer such that it is in contact with the portions of the transmission electrodes 109 exposed by the opening portions 116. Also, an upper electrode 112 arranged on the organic function layer 111, a sealing layer 113 arranged on the upper electrode 112, and a color filter 114 arranged on the sealing layer 113 are formed using desired processes. With these processes, a light emitting device 100 including, in a display region 201, a pixel 150 in which the sub-pixels 151 (light emitting elements 120) as shown in FIG. 1B are arranged is formed.

According to the structure in which the reflective layer 105 and the transmission electrode 109 are connected by the conductive plug 110 shown in this embodiment, it is possible to avoid the decrease of the film thickness of the optical distance adjustment layer 107 caused by planarization processing (polishing processing) such as CMP processing performed when forming the conductive plug 110. That is, if a plug is formed by providing a via in the optical distance adjustment layer 107 serving as an underlying layer before formation of the transmission electrode 109, and the transmission electrode 109 is to be formed on that, planarization processing such as CMP processing needs to be performed to planarize the upper surface of the underlying layer on which the transmission electrode 109 is to be formed. However, according to the conductive plug 110 shown in this embodiment, the conductive plug can be formed after formation of the transmission electrode 109. For this reason, planarization processing such as CMP processing need not be performed after formation of the optical distance adjustment layer 107. It is therefore possible to easily form the optical distance adjustment layers 107b, 107g, and 107r having the desired film thicknesses Tb, Tg, and Tr suitable for the light emitting elements 120b, 120g, and 120r of the sub-pixels 151b, 151g, and 151r. As a result, it is possible to improve the light emission efficiency and the color purity of the light emitting device 100.

Furthermore, the contact hole 115 which extends through the insulating layer 108 and the optical distance adjustment layer 107 to reach the transmission electrode 109, and a part of which reaches the reflective layer 105 is formed, and the conductive plug 110 is formed in the contact hole 115. If this configuration is used, it is possible to electrically connect the reflective layer 105 and the transmission electrode 109 while suppressing a connection failure without making the reflective layer 105 and the transmission electrode 109 excessively overlap the conductive plug 110. That is, the pixel 150 (sub-pixel 151) can be micronized. As a result, a high-definition light emitting device 100 can be implemented.

Figure 5:
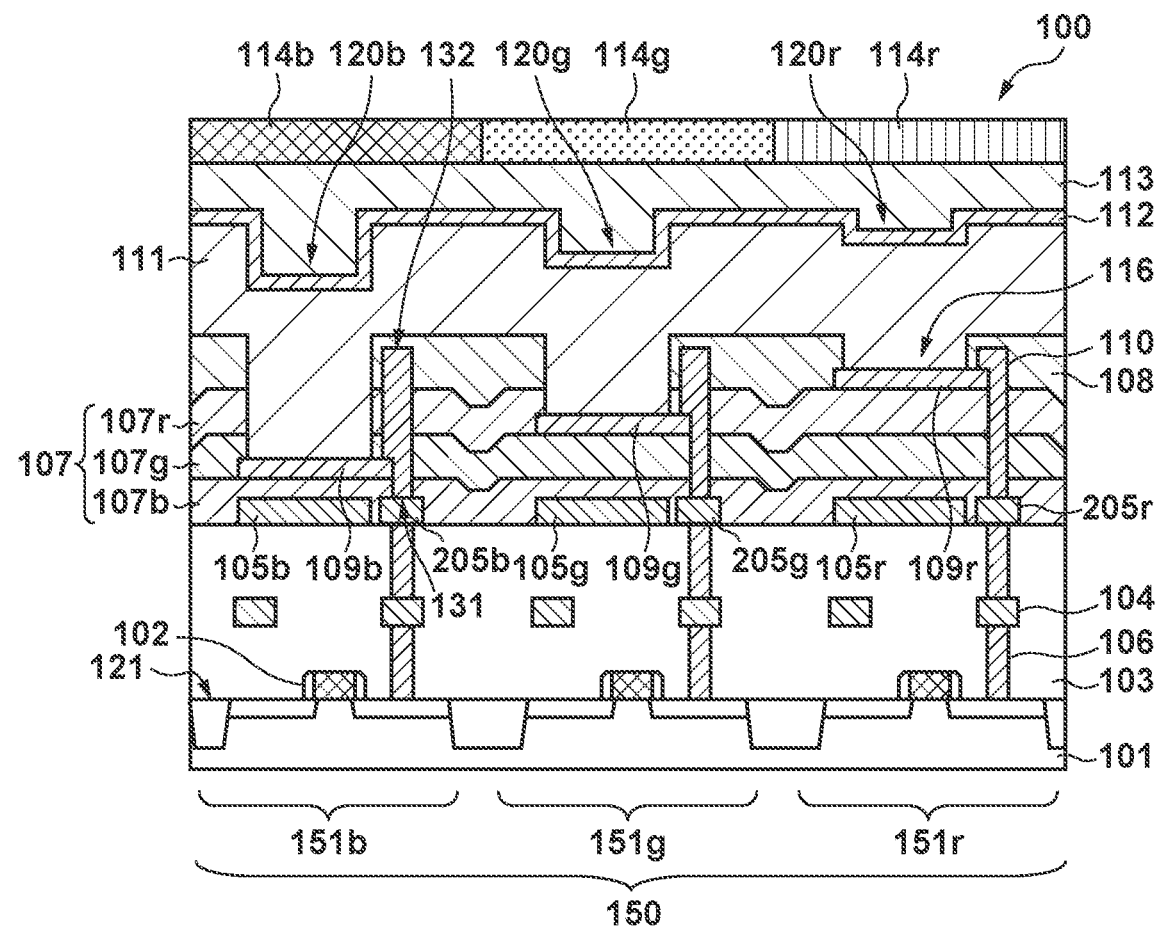
FIG. 5 is a sectional view showing a modification of the light emitting device shown in FIGS. 1A and 1B.

A modification of the above-described light emitting device 100 will be described with reference to FIG. 5. In the light emitting device 100 shown in FIG. 5, each of the light emitting elements 120 arranged in the plurality of sub-pixels 151 includes not only the reflective layer 105 but also a conductive member 205 arranged in the same layer as the reflective layer 105. The reflective layer 105 and the conductive member 205 are electrically separated. In the example shown in FIG. 5, the conductive member 205 is electrically connected to the conductive plug 106 of the lower layer. However, the reflective layer 105 is not electrically connected to the lower layers and is floating. The reflective layer 105 may electrically be connected to another lower layer by a conductive member other than the conductive plug 106. The conductive member 205 can be formed by forming the reflective layer 105, as shown in FIG. 2A described above, and then electrically separating the portion of the reflective layer 105 connected to the conductive plug 106 from the remaining portion of the reflective layer 105. As a result, the portion connected to the conductive plug 106 becomes the conductive member 205, and the remaining portion becomes the reflective layer 105. The upper surface of the reflective layer 105 and the upper surface of the conductive member 205 are flush with each other.

In this modification as well, the conductive plug 110 is formed to extend from the insulating layer 108 to pass through the optical distance adjustment layer 107 and reach the height of the upper surface of the reflective layer 105 while being in electrical contact with the transmission electrode 109. The conductive member 205 may not be formed, and the conductive plug 110 may be in direct contact with the conductive plug 106. That is, the conductive plug 110 may be formed to extend to reach the lower surface of the reflective layer 105.

Figure 6:
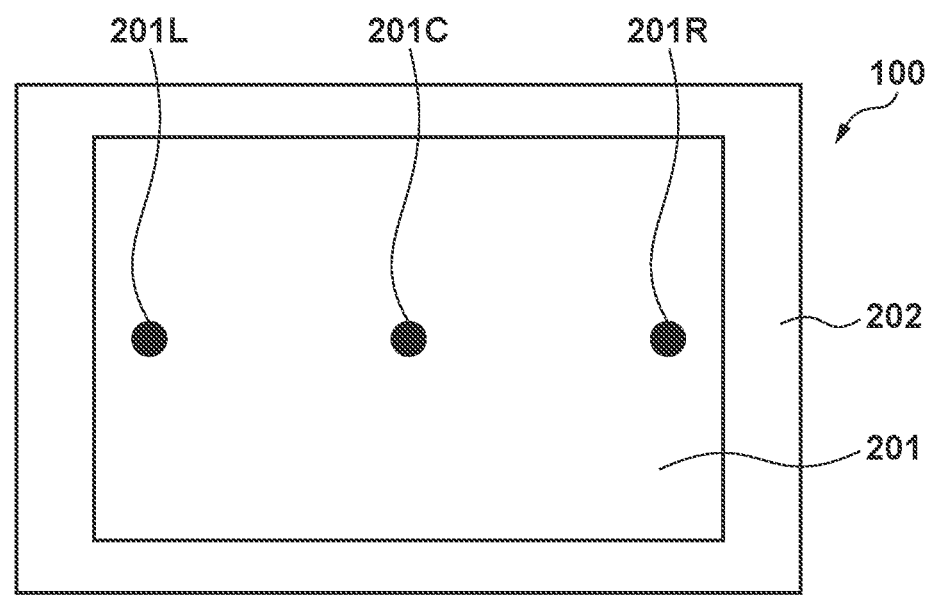
FIG. 6 is a plan view showing a modification of the light emitting device shown in FIGS. 1A and 1B.

Another modification of the above-described light emitting device 100 will be described with reference to FIGS. 6 to 8. As shown in FIG. 6, the light emitting device 100 includes the display region 201 in which the plurality of pixels 150 are arranged in a two-dimensional array, and the peripheral circuit region 202 that controls the write operation of the pixel signals of an image to be displayed in the display region 201. Here, the center portion of the display region 201 is defined as a display region 201C. Also, a region on the left side in FIG. 6, which is closer to the outer edge of the display region 201 than the display region 201C, is defined as a display region 201L, and a region on the right side in FIG. 6, which is closer to the outer edge of the display region 201 than the display region 201C, is defined as a display region 201R.

Figure 7A:
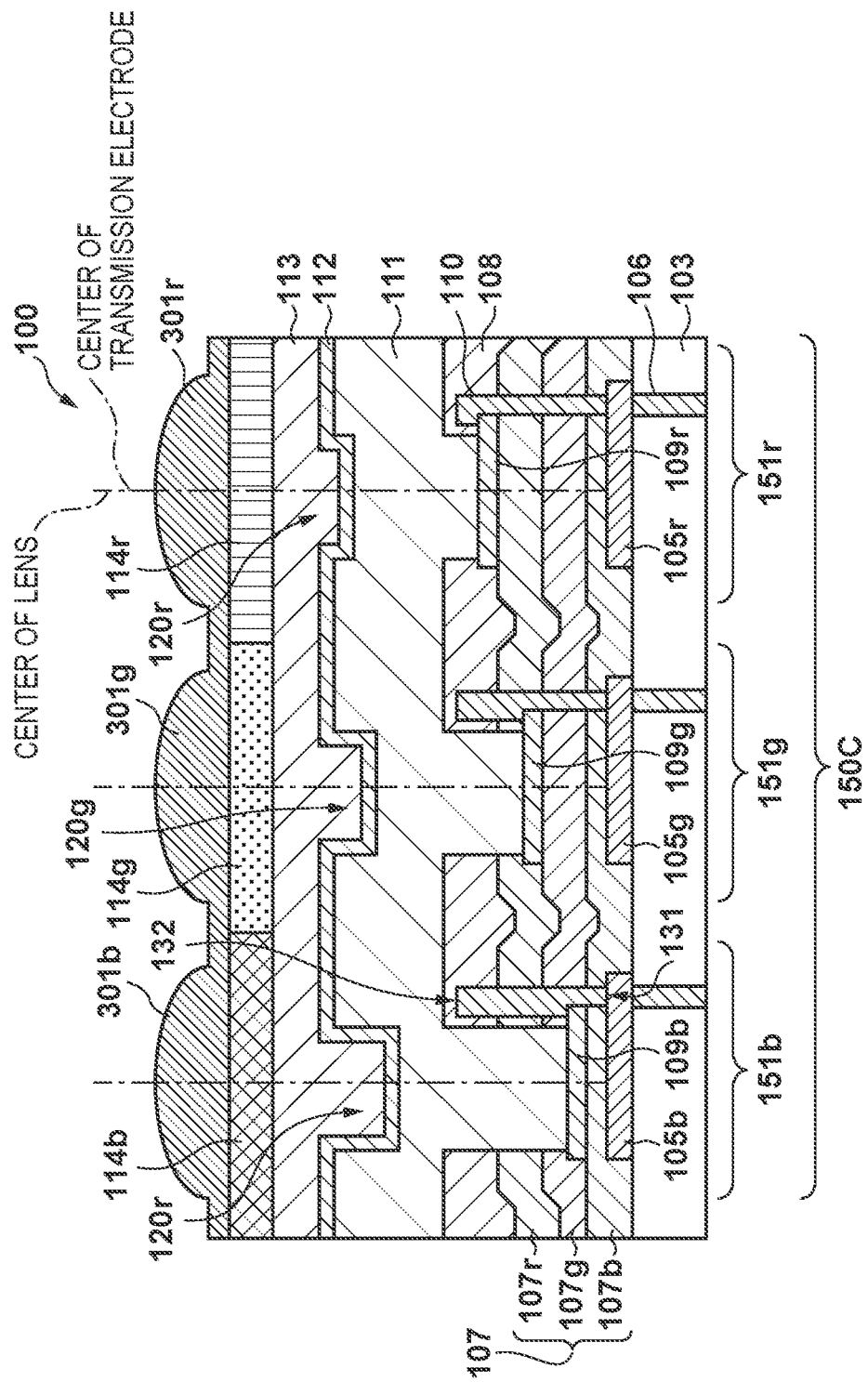
FIGS. 7A and 7B are sectional views of the light emitting device shown in FIG. 6.

As shown in FIG. 7A, in this embodiment, in addition to the configuration shown in FIG. 1B, a microlens 301 is further arranged in each of the plurality of sub-pixels 151 at a position farther apart from the main surface 121 of the substrate 101 than the organic function layer 111 including the light emitting layer. The microlens 301 is arranged on the color filter 114. In other words, the color filter 114 is arranged between the microlens 301 and the organic function layer 111 including the light emitting layer. Here, in FIGS. 6 to 8, the constituent elements under (on a side close to the main surface 121 of the substrate 101) the reflective layer 105 may be the same as in FIG. 1B. Hence, the constituent elements on the side closer to the substrate 101 than the interlayer dielectric layer 103 are not illustrated.

The microlens 301 is formed into a hemispherical shape or a teardrop shape using, for example, a transparent resin. Radiation of light that is generated by the light emitting layer included in the organic function layer 111 and caused to obtain different peak wavelengths by the resonator structures included in the light emitting elements 120b, 120g, and 120r of the sub-pixels 151b, 151g, and 151r is converged by the microlenses 301. To form the microlens 301, first, a transparent resin is deposited using an appropriate method such as a coating method. Next, the transparent resin is formed into a desired pattern shape using a photolithography process or the like, and the patterned transparent resin is heat-treated and fluidized, thereby forming the microlens 301.

Also, in this embodiment, in some regions of the display region 201, the sub-pixel 151 is formed such that the center of the color filter 114 and the microlens 301 is relatively shifted from the center of the corresponding transmission electrode 109. Here, the "center" of the transmission electrode 109 can be the position of geometrical center of gravity of the transmission electrode 109 in an orthogonal projection to the main surface 121 of the substrate 101. In the orthogonal projection to the main surface 121 of the substrate 101, if the transmission electrode 109 has, for example, a rectangular shape, the center is the intersection of the two diagonal lines. This meaning of "center" also applies to the color filter 114 and the microlens 301.

Figure 7B:
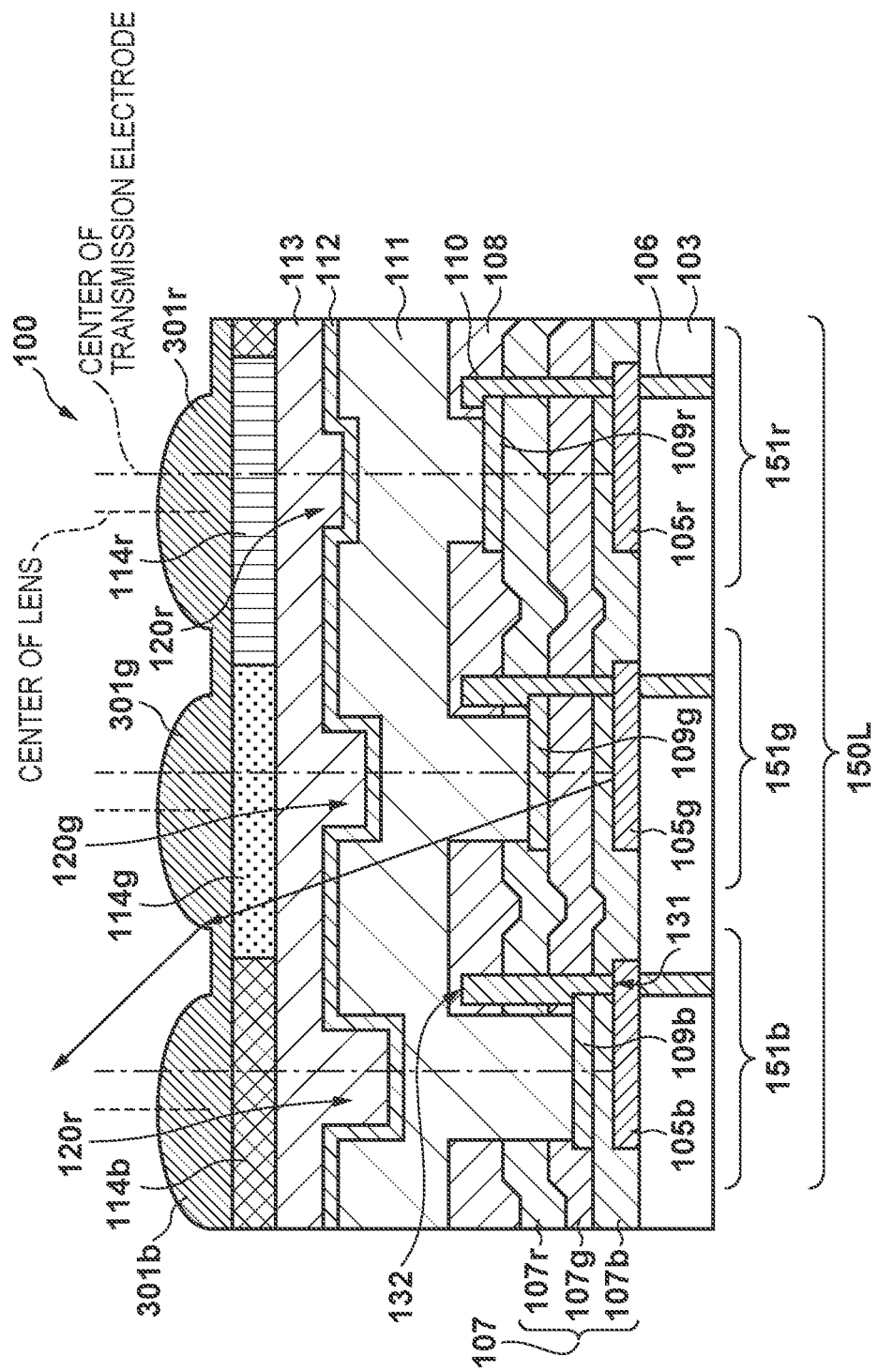

More specifically, in the display region 201C at the center of the display region 201, as shown in FIG. 7A, the center of the transmission electrode 109 of the light emitting element 120 of each sub-pixel 151 of a pixel 150C and the center of the corresponding color filter 114 and microlens 301 are arranged to match each other. On the other hand, in pixels 150L and 150R arranged in the display regions 201L and 201R closer to the outer edge of the display region 201, as shown in FIGS. 7B and 8, the center of the transmission electrode 109 of the light emitting element 120 of each sub-pixel 151 of the pixels 150L and 150R and the center of the corresponding color filter 114 and microlens 301 are arranged to be shifted.

More specifically, the pixels 150 include the pixel 150C (shown in FIG. 7A) arranged in the display region 201C at the center of the display region 201, and the pixels 150L and 150R (shown in FIGS. 7B and 8) arranged at positions (the display regions 201L and 201R) closer to the outer edge of the display region 201 with the plurality of pixels 150 than the pixel 150C. Here, in the orthogonal projection to the main surface 121 of the substrate 101, the distance between the center of the transmission electrode 109 of the light emitting element 120 arranged in each sub-pixel 151 of the pixels 150L and 150R and the center of the microlens 301 of the light emitting element 120 arranged in each sub-pixel 151 of the pixels 150L and 150R is longer than the distance between the center of the transmission electrode 109 of the light emitting element 120 arranged in each sub-pixel 151 of the pixel 150C and the center of the microlens 301 of the light emitting element 120 arranged in each sub-pixel 151 of the pixel 150C. In this case, as shown in FIGS. 7B and 8, in the light emitting element 120 arranged in each sub-pixel 151 of the pixels 150L and 150R, the center of the microlens 301 is shifted from the center of the transmission electrode 109 in a direction from the center of the display region 201 to the outer edge of the display region 201. That is, as shown in FIGS. 6 and 7B, in the light emitting element 120 arranged in each sub-pixel 151 of the pixel 150L arranged in the display region 201L that is the region on the left side of the display region 201C, the center of the microlens 301 is shifted to the left side from the center of the transmission electrode 109. Similarly, as shown in FIGS. 6 and 8, in the light emitting element 120 arranged in each sub-pixel 151 of the pixel 150R arranged in the display region 201R that is the region on the right side of the display region 201C, the center of the microlens 301 is shifted to the right side from the center of the transmission electrode 109. In each light emitting element 120 arranged in the plurality of sub-pixels 151, the distance (shift amount) between the center of the transmission electrode 109 and the center of the corresponding microlens 301 in the orthogonal projection to the main surface 121 of the substrate 101 may increase continuously or stepwise from the center of the display region 201 to the outer edge of the display region 201.

Similarly, in the orthogonal projection to the main surface 121 of the substrate 101, the distance between the center of the transmission electrode 109 of the light emitting element 120 arranged in each sub-pixel 151 of the pixels 150L and 150R and the center of the color filter 114 of the light emitting element 120 arranged in each sub-pixel 151 of the pixels 150L and 150R may be longer than the distance between the center of the transmission electrode 109 of the light emitting element 120 arranged in each sub-pixel 151 of the pixel 150C and the center of the color filter 114 of the light emitting element 120 arranged in each sub-pixel 151 of the pixel 150C. In this case, as shown in FIGS. 7B and 8, in the light emitting element 120 arranged in each sub-pixel 151 of the pixels 150L and 150R, the center of the color filter 114 is shifted from the center of the transmission electrode 109 in a direction from the center of the display region 201 to the outer edge of the display region 201. That is, as shown in FIGS. 6 and 7B, in the light emitting element 120 arranged in each sub-pixel 151 of the pixel 150L arranged in the display region 201L that is the region on the left side of the display region 201C, the center of the color filter 114 is shifted to the left side from the center of the transmission electrode 109. Similarly, as shown in FIGS. 6 and 8, in the light emitting element 120 arranged in each sub-pixel 151 of the pixel 150R arranged in the display region 201R that is the region on the right side of the display region 201C, the center of the color filter 114 is shifted to the right side from the center of the transmission electrode 109. In each light emitting element 120 arranged in the plurality of sub-pixels 151, the distance (shift amount) between the center of the transmission electrode 109 and the center of the corresponding color filter 114 in the orthogonal projection to the main surface 121 of the substrate 101 may increase continuously or stepwise from the center of the display region 201 to the outer edge of the display region 201.

Here, in each light emitting element of the plurality of light emitting elements 120, the distance (shift amount) between the center of the transmission electrode 109 and the center of the corresponding color filter 114 in the orthogonal projection to the main surface 121 of the substrate 101 may be equal to or less than the distance between the center of the transmission electrode 109 and the center of the corresponding microlens 301 in the orthogonal projection to the main surface 121 of the substrate 101. This is because the color filter 114 is arranged between the transmission electrode 109 and the microlens 301 to the light from the light emitting layer of the organic function layer 111. Also, in the orthogonal projection to the main surface 121 of the substrate 101, in each sub-pixel of the plurality of sub-pixels 151, the center of the microlens 301 and the center of the corresponding color filter 114 may be located at the same position. This is because the distance from the microlens 301 to the color filter 114 is shorter than the distance from the transmission electrode 109 to the color filter 114 and the microlens 301.

As described above, the center position of the color filter 114 and the microlens 301 is arranged to be shifted from the center position of the transmission electrode 109 in the direction of separating from the center position of the display region 201 to the outer edge side. With this configuration, the light emitting device 100 can emit light at a wide angle as indicated by arrows in FIGS. 7B and 8, and obtain a wider viewing angle characteristic.

Figure 8:
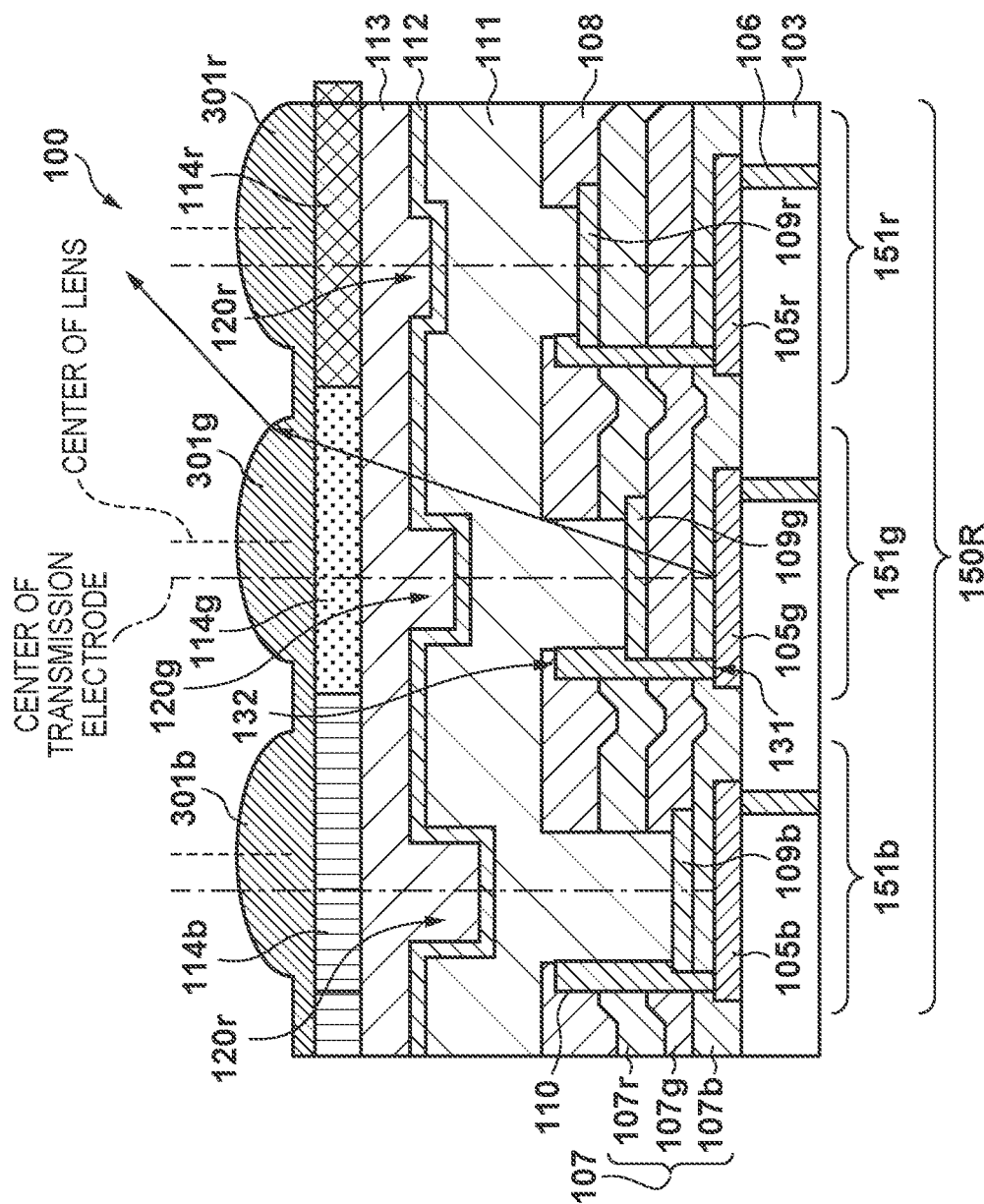
FIG. 8 is a sectional view of the light emitting device shown in FIG. 6.

In addition, as shown in FIGS. 7B and 8, in the orthogonal projection to the main surface 121 of the substrate 101, the conductive plug 110 may be in contact with the transmission electrode 109 at the portion of the peripheral edge portion of the transmission electrode 109 close to the center of the display region 201. Here, the portion of the transmission electrode 109 close to the center of the display region 201 may be a region of the transmission electrode 109, which is on the center side of the display region 201 and has a ½ area in the orthogonal projection to the main surface 121 of the substrate 101. For example, if the transmission electrode 109 has an almost rectangular shape, the portion may be a side of the transmission electrode 109 arranged on the center side of the display region 201.

As shown in FIGS. 6 and 7B, in the light emitting element 120 arranged in each sub-pixel 151 of the pixel 150L arranged in the display region 201L that is the region on the left side of the display region 201C, the conductive plug 110 is arranged on the right side of the transmission electrode 109 close to the center of the display region 201. Similarly, as shown in FIGS. 6 and 8, in the light emitting element 120 arranged in each sub-pixel 151 of the pixel 150R arranged in the display region 201R that is the region on the right side of the display region 201C, the conductive plug 110 is arranged on the left side of the transmission electrode 109 close to the center of the display region 201. Thus, the conductive plug 110 is arranged at a position reverse to the direction of shifting the center of the color filter 114 and the microlens 301 with respect to the center of the transmission electrode 109. This arrangement can prevent the conductive plug 110 from causing eclipse of light spreading on the wide-angle side and suppress degradation of the wide viewing angle characteristic.

In the description using FIGS. 6 to 8, an example in which the display region 201 is divided into three regions, that is, the display region 201C at the center position and the display regions 201L and 201R located on the left and right sides of the display region 201C has bene described. However, the present invention is not limited to this. The shift direction and the shift amount can be appropriately selectively applied to a plurality of regions in accordance with a relative position from the center position of the display region 201 to the outer edge.

Application examples in which the light emitting device 100 according to this embodiment is applied to an image forming device, a display device, a photoelectric conversion device, an electronic apparatus, an illumination device, a moving body, and a wearable device will be described here with reference to FIGS. 9A to 17B. Details of the components of the above-described light emitting device 100 and modifications will be described first, and the application examples will be described after that. In the following explanation, the configuration of the light emitting element 120 including the transmission electrode 109, the organic function layer 111, and the upper electrode 112 described above will sometimes be expressed as an organic light emitting element.

The organic light emitting element according to this embodiment includes at least a first electrode and a second electrode, and an organic compound layer arranged between the electrodes. As for the first electrode and the second electrode, one is an anode, and the other is a cathode. In the organic light emitting element according to this embodiment, the organic compound layer may be either a single layer or a stacked body formed by a plurality of layers if it includes a light emitting layer. Here, if the organic compound layer is a stacked body formed by a plurality of layers, the organic compound layer may include a hole injection layer, a hole transport layer, an electron blocking layer, a hole/exciton blocking layer, an electron transport layer, an electron injection layer, and the like, in addition to the light emitting layer. The light emitting layer may be a single layer or a stacked body formed by a plurality of layers.

In the organic light emitting element according to this embodiment, at least one layer of the organic compound layer contains an organic metal complex according to this embodiment. More specifically, the organic compound according to this embodiment is contained in one of the light emitting layer, the hole injection layer, the hole transport layer, the electron blocking layer, the hole/exciton blocking layer, the electron transport layer, and the electron injection layer described above. The organic compound according to this embodiment may be contained in the light emitting layer.

In the organic light emitting element according to this embodiment, if the organic compound according to this embodiment is contained in the light emitting layer, the light emitting layer may be a layer made of only the organic compound according to this embodiment or a layer made of the organic metal complex according to this embodiment and another compound. Here, if the light emitting layer is a layer made of the organic metal complex according to this embodiment and another compound, the organic compound according to this embodiment may be used as a host or a guest of the light emitting layer. Alternatively, the organic compound may be used as an assist material that can be contained in the light emitting layer. Here, the host is a compound whose mass ratio is largest in the compounds forming the light emitting layer. The guest is a compound whose mass ratio is smaller than that of the host in the compounds forming the light emitting layer, and is a compound responsible for main light emission. The assist material is a compound whose mass ratio is smaller than that of the host in the compounds forming the light emitting layer, and which assists light emission of the guest. Note that the assist material is also called a second host. The host material can be called a first compound, and the assist material as a second compound.

If the organic compound according to this embodiment is used as the guest of the light emitting layer, the concentration of the guest may be 0.01 mass % (inclusive) to 20 mass % (inclusive) relative to the entire light emitting layer, or may be 0.1 mass % (inclusive) to 10 mass % (inclusive).

The present inventors have made various examinations and found that if the organic compound according to this embodiment is used as the host or guest of the light emitting layer, particularly, as the guest of the light emitting layer, an element that exhibits a light output in high brightness at a high efficiency and has a very high durability can be obtained. The light emitting layer may be a single layer or a multilayer structure. If a light emitting material having another light emission color is contained, the color can be mixed with red that is the light emission color in this embodiment. The multilayer structure means a state in which the light emitting layer and another light emitting layer are stacked. In this case, the light emission color of the organic light emitting element is not limited to red. More specifically, it may be white or an intermediate color. If the color is white, the other light emitting layer emits light in a color other than red, that is, blue or green. As the film forming method, vapor deposition or coating is used to form a film. Details will be described in embodiments to be described later.

The organic metal complex according to this embodiment can be used as the constituent material of the organic compound layer other than the light emitting layer forming the organic light emitting element according to this embodiment. More specifically, the organic metal complex may be used as the constituent material of an electron transport layer, an electron injection layer, a hole transport layer, a hole injection layer, a hole blocking layer, or the like. In this case, the light emission color of the organic light emitting element is not limited to red. More specifically, it may be white or an intermediate color.

Here, in addition to the organic compound according to this embodiment, a conventionally known low molecular and high molecular hole injection compound or hole transport compound, a compound serving as a host, a light emitting compound, an electron injection compound or electron transport compound, or the like can be used together as needed. Examples of these compounds will be described below.

A hole injection/transport material can be a material that has a high hole mobility such that hole injection from the anode is facilitated, and injected holes can be transported to the light emitting layer. It can also be a material having a high glass transition point temperature to suppress degradation of film quality such as crystallization in the organic light emitting element. Examples of low molecular and high molecular materials having hole injection/transport performance are a triarylamine derivative, an arylcarbazole derivative, a phenylenediamine derivative, a stilbene derivative, a phthalocyanine derivative, a porphyrin derivative, a poly(vinyl carbazole), a poly(thiophene), and other conductive polymers. The above-described hole injection/transport material can be used for the electron blocking layer as well. Detailed examples of compounds used as the hole injection/transport material will be shown below. The material is not limited to these, as a matter of course.

HT1
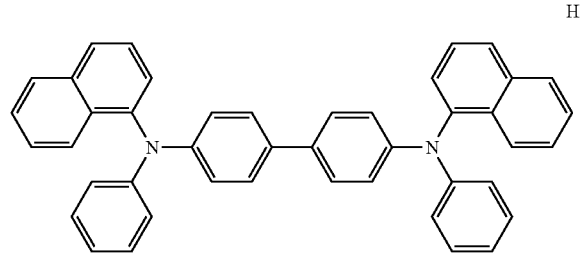
HT2
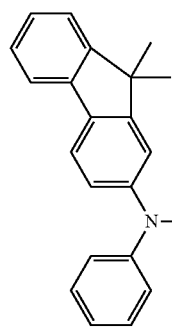
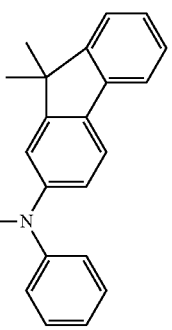
HT3
HT4
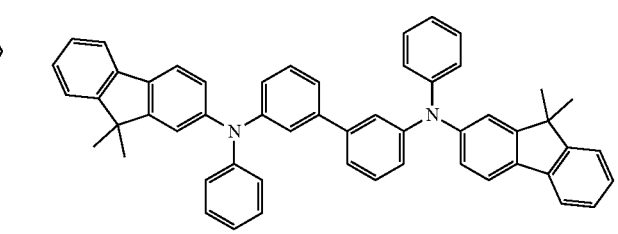
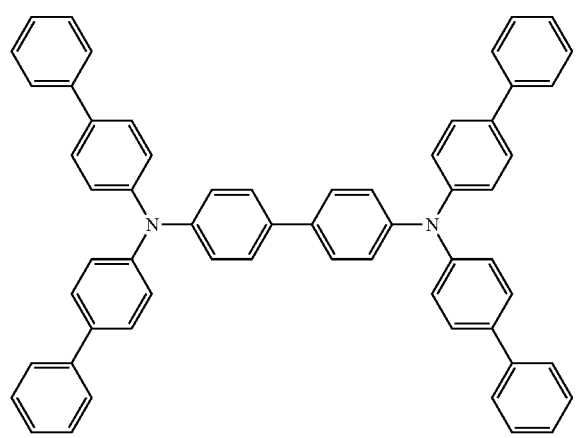
HT5
HT6
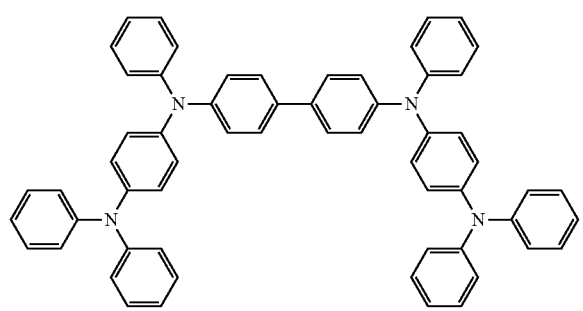
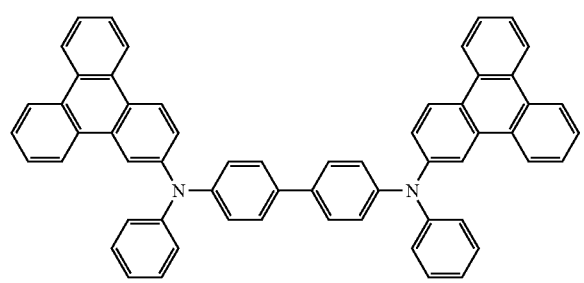
HT7
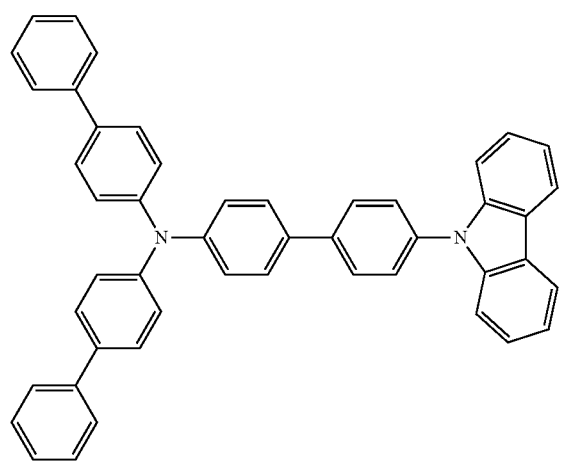
HT8
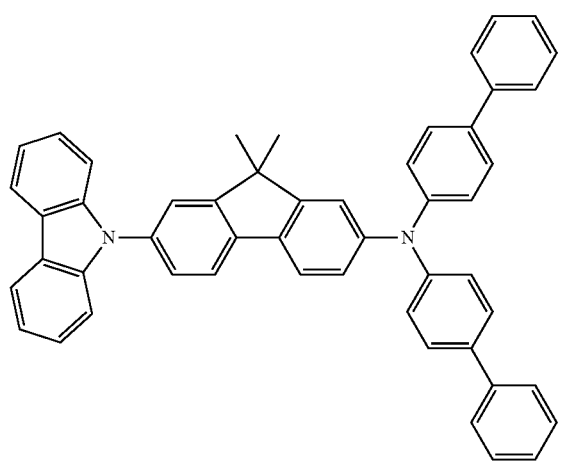

-continued
HT9
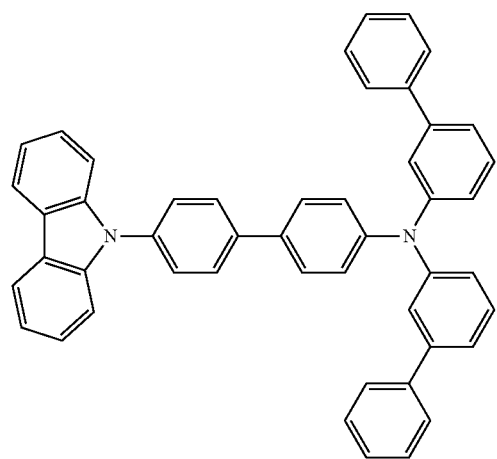
HT10
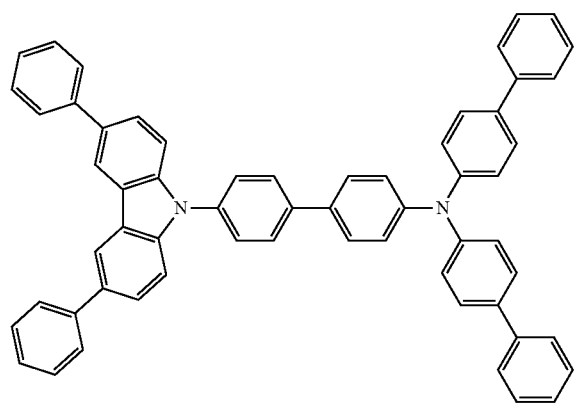
HT11
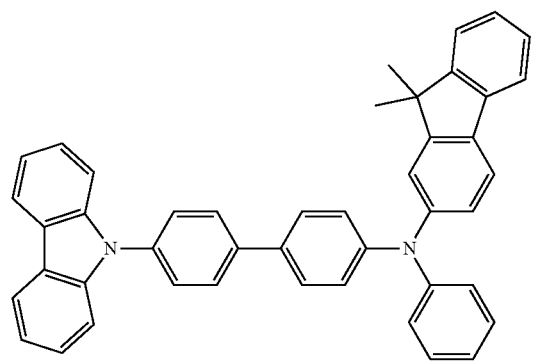
HT12
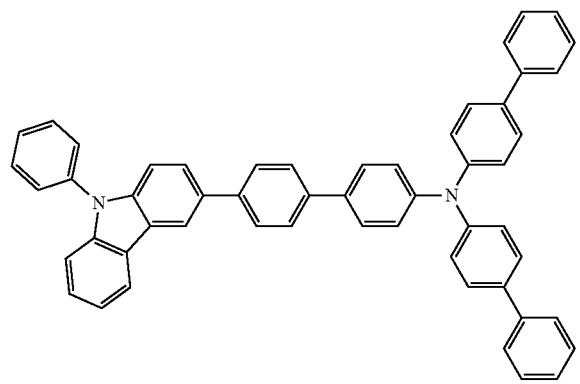
HT13
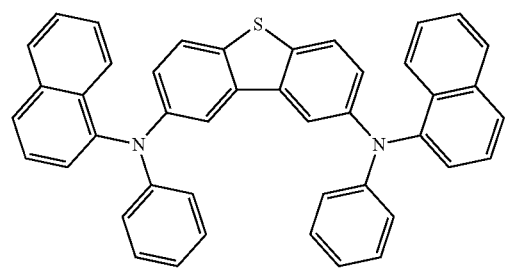
HT14
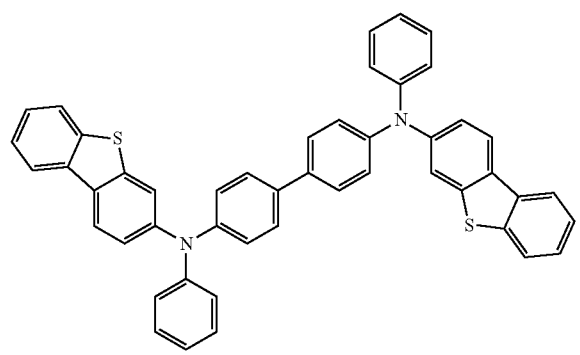

-continued

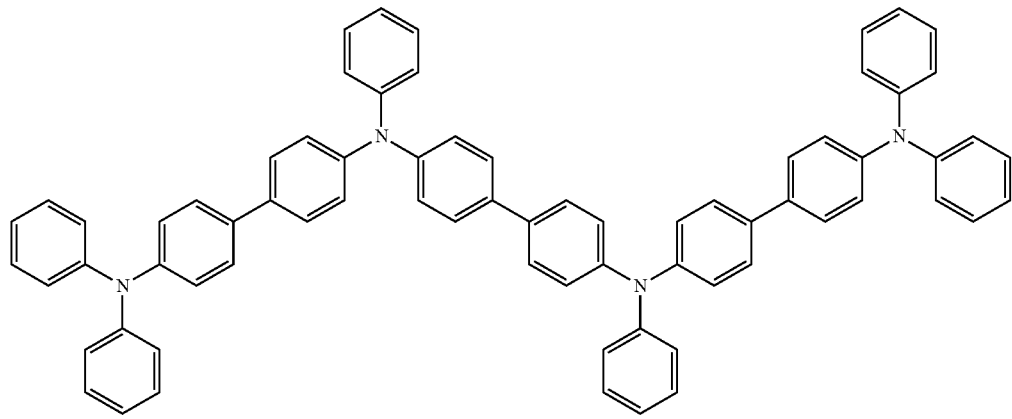
HT15

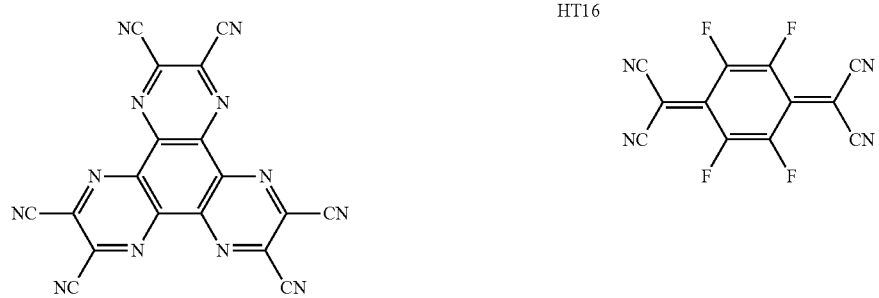
HT16

HT17

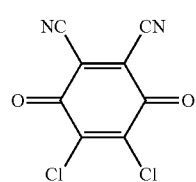
HT18

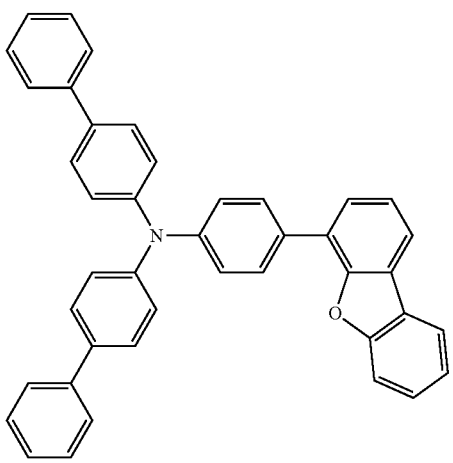
HT19

In the hole transport materials, HT16 to HT18 can decrease the driving voltage when used in a layer in contact with the anode. HT16 is widely used in an organic light emitting element. HT2, HT3, HT4, HT5, HT6, HT10, and HT12 can be used in an organic compound layer adjacent to HT16. A plurality of materials may be used in one organic compound layer.

Examples of the light emitting material mainly concerning the light emitting function are condensed-ring compounds (for example, a fluorene derivative, a naphthalene derivative, a pyrene derivative, a perylene derivative, a tetracene derivative, an anthracene derivative, and rubrene), a quinacridone derivative, a coumarin derivative, a stilbene derivative, an organic aluminum complex such as tris(8-quinolinolato)aluminum, an iridium complex, a platinum complex, a rhenium complex, a copper complex, a europium complex, a ruthenium complex, and polymer derivatives such as a poly(phenylenevinylene) derivative, a poly(fluorene) derivative, and a poly(phenylene) derivative.

Detailed examples of compounds used as the light emitting material will be shown below. The material is not limited to these, as a matter of course.

BD1 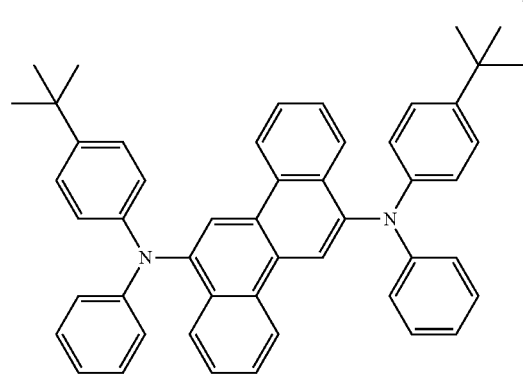
BD2 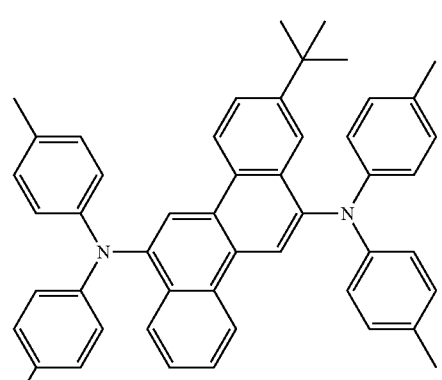
BD3 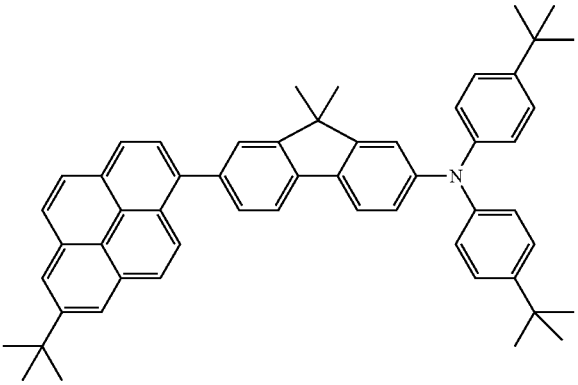
BD4 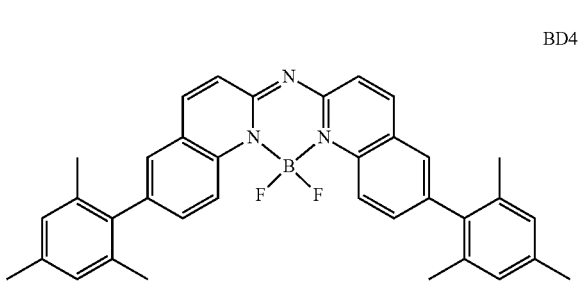
-continued
BD5 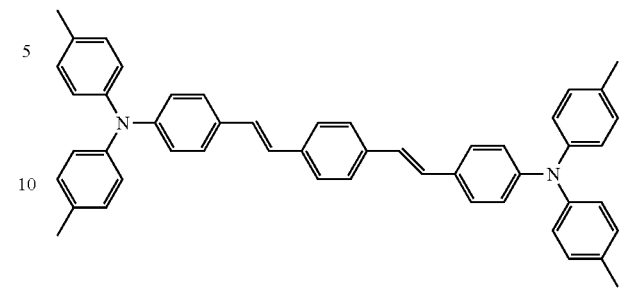
BD6 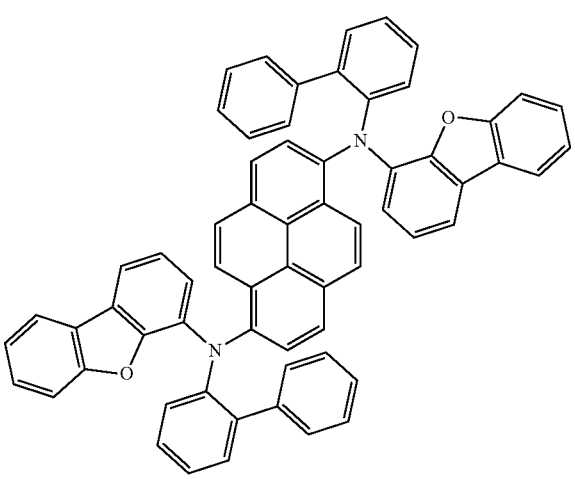
BD7 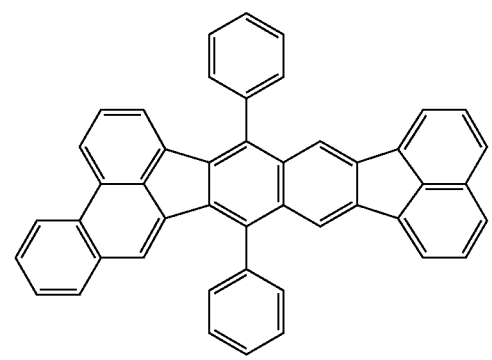
BD8 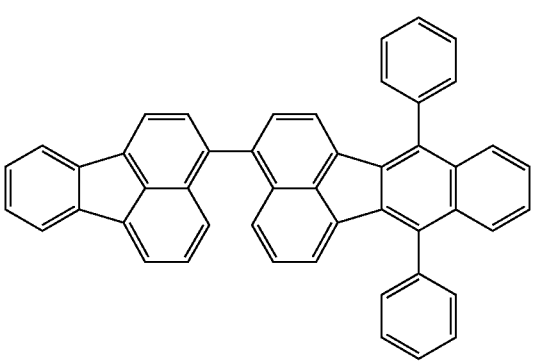

BD9
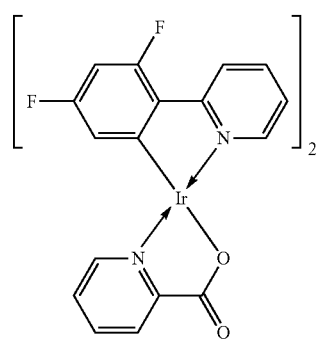
GD3
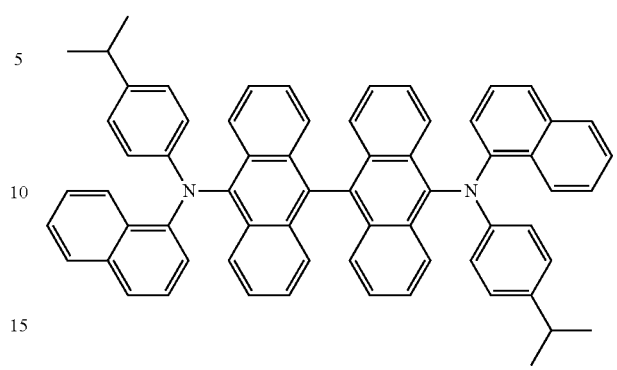
BD10
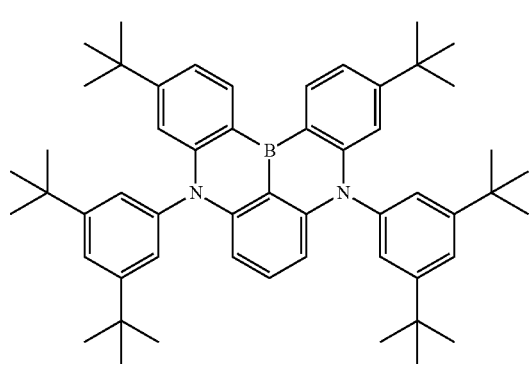
GD4
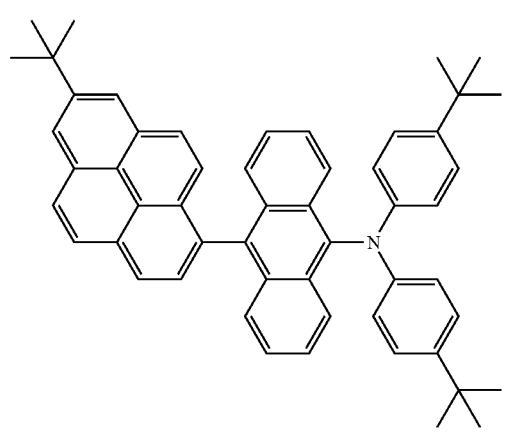
GD1
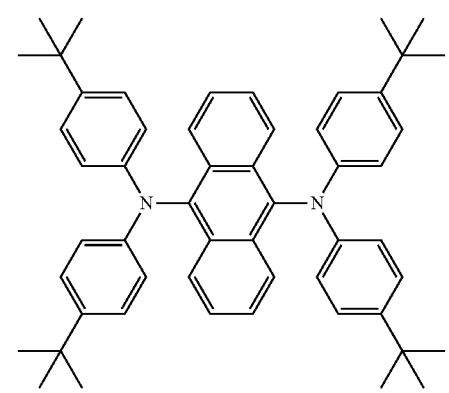
GD5
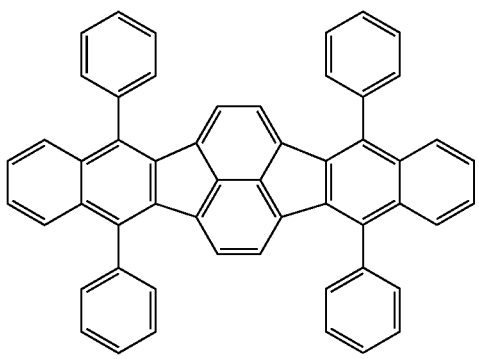
GD2
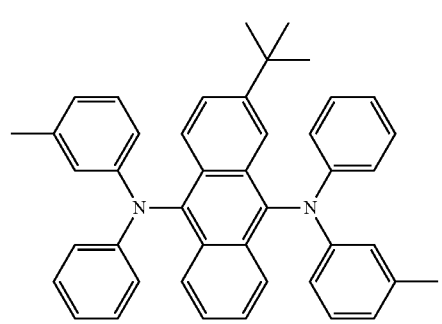
GD6
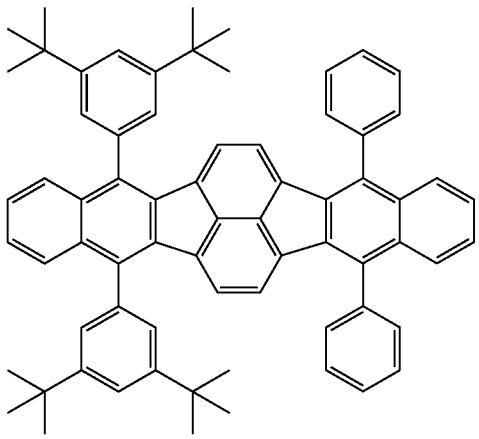

GD7
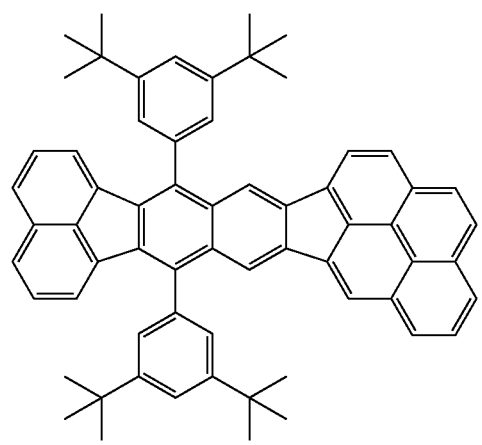
GD8
GD9
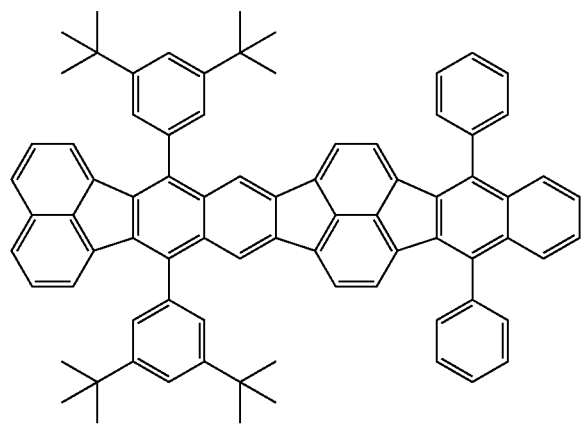
GD10
GD11
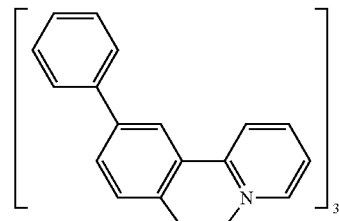
GD12
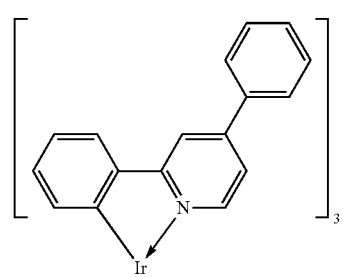
GD13
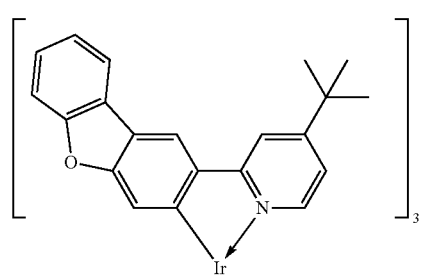
GD14
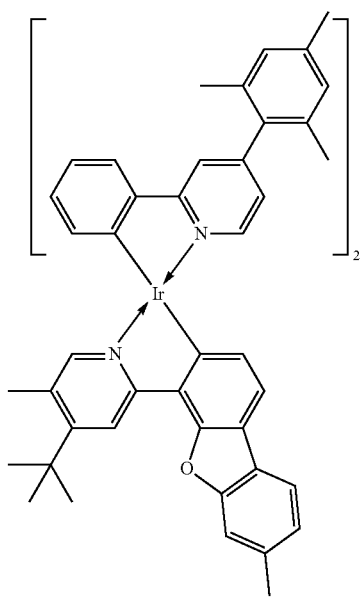

GD15 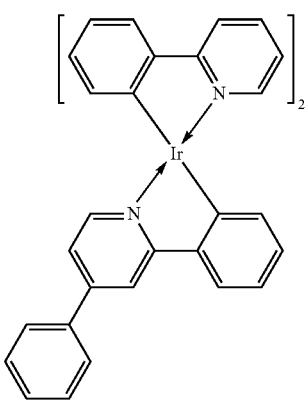
RD1 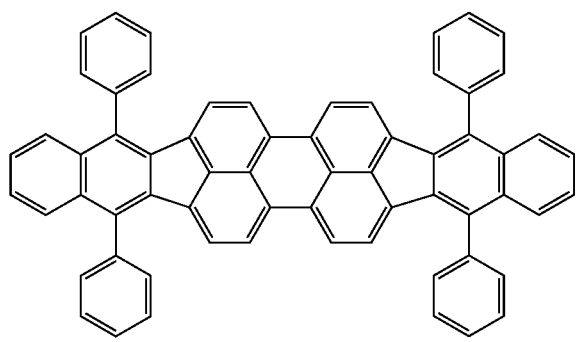
RD2 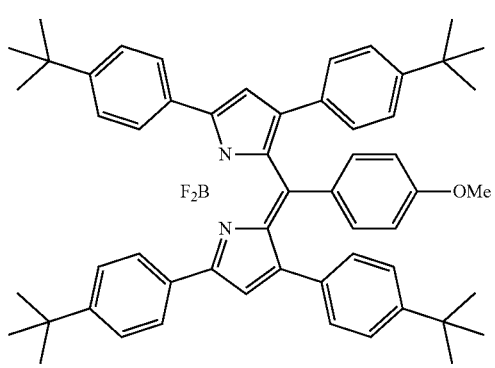
RD3 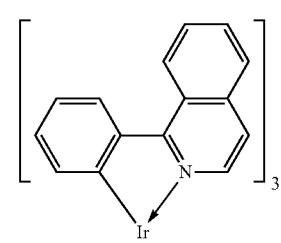
RD4 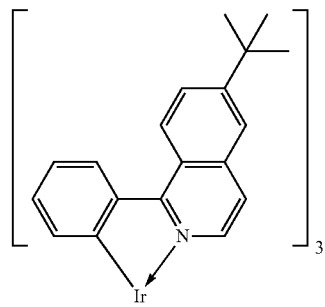
RD5 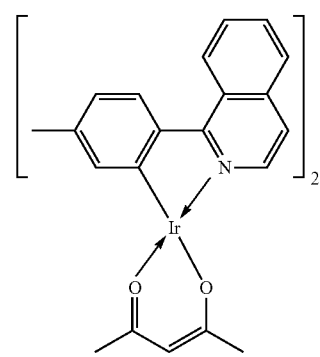
RD6 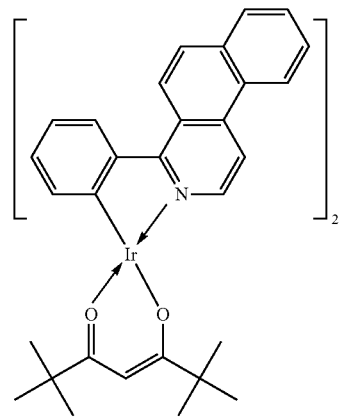
RD7 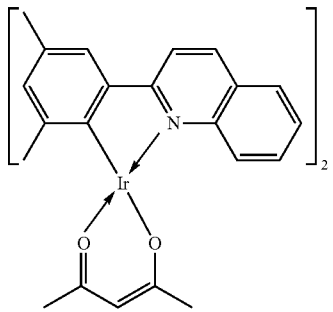

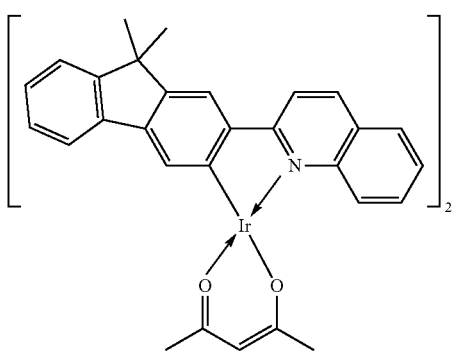

RD8

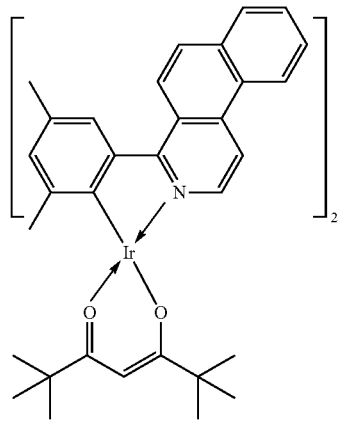

RD10

If the light emitting material is a hydrocarbon compound, it is possible to reduce lowering of light emission efficiency caused by exciplex formation or lowering of color purity due to a change of the light emission spectrum of the light emitting material caused by exciplex formation.

The hydrocarbon compound is a compound made of only carbon and hydrogen, and includes BD7, BD8, GD5 to GD9, and RD1 in the compounds exemplified above.

If the light emitting material is a condensed polycyclic compound including a 5-membered ring, oxidation hardly occurs because of a high ionization potential, and a long-life element with high durability can be obtained. This includes BD7, BD8, GD5 to GD9, and RD1 in the compounds exemplified above.

Examples of the light emitting layer host or the light emission assist material contained in the light emitting layer are an aromatic hydrocarbon compound or its derivative, a carbazole derivative, a dibenzofuran derivative, a dibenzothiophene derivative, an organic aluminum complex such as tris(8-quinolinolato)aluminum, and an organic beryllium complex.

Detailed examples of compounds used as the light emitting layer host or the light emission assist material contained in the light emitting layer will be shown below. The material is not limited to these, as a matter of course.

RD9

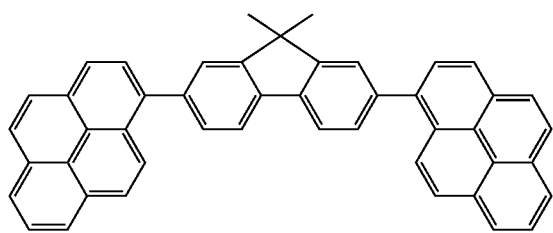

EM1

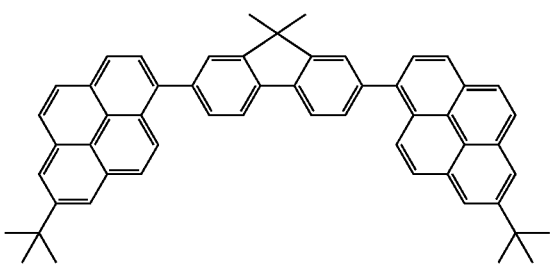

EM2

EM3

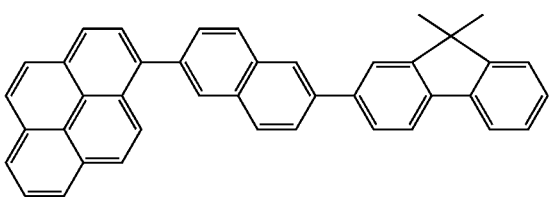

EM4

-continued
EM5
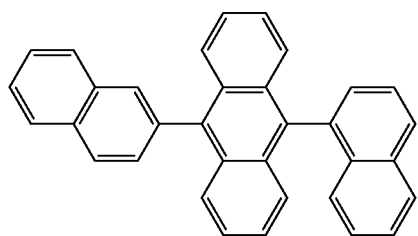
EM6
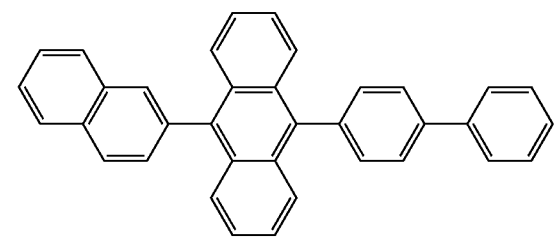
EM7
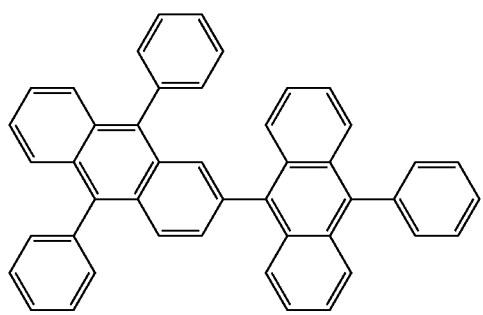
EM8
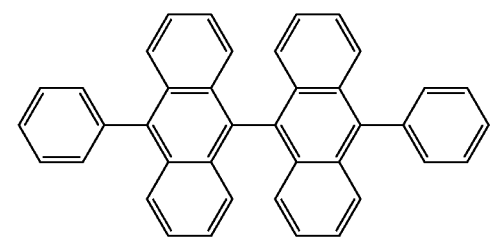
EM9
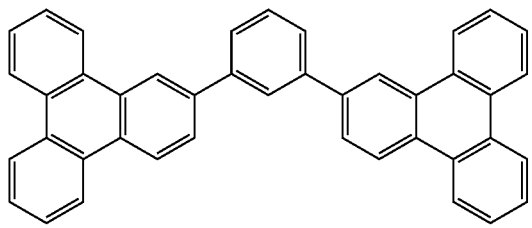
EM10
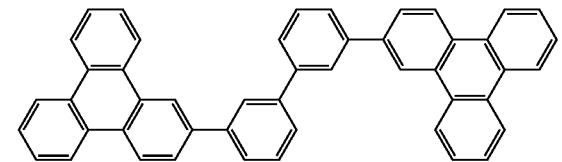
EM11
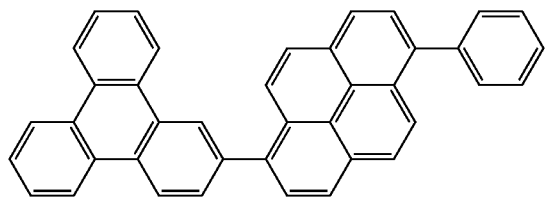
EM12
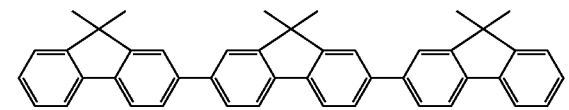
EM13
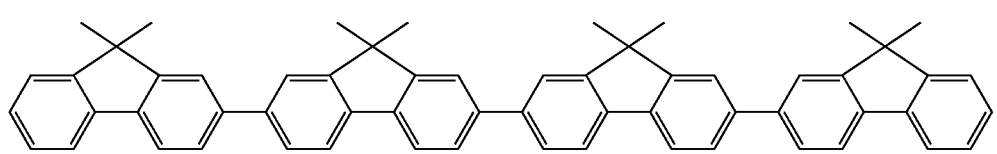
EM14
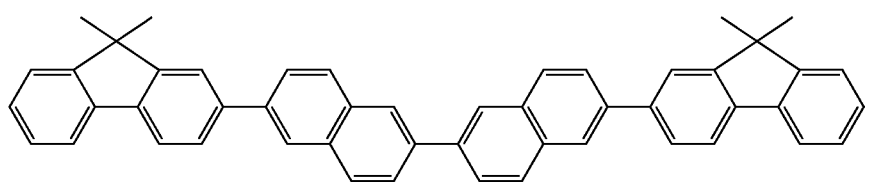

-continued
EM15
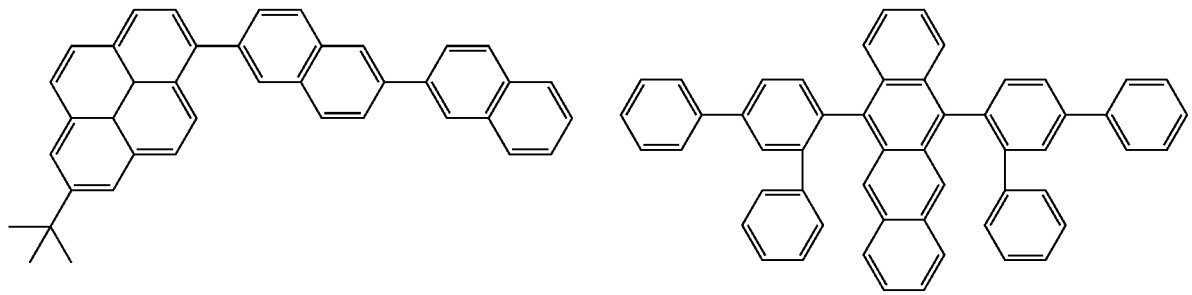
EM16
EM17
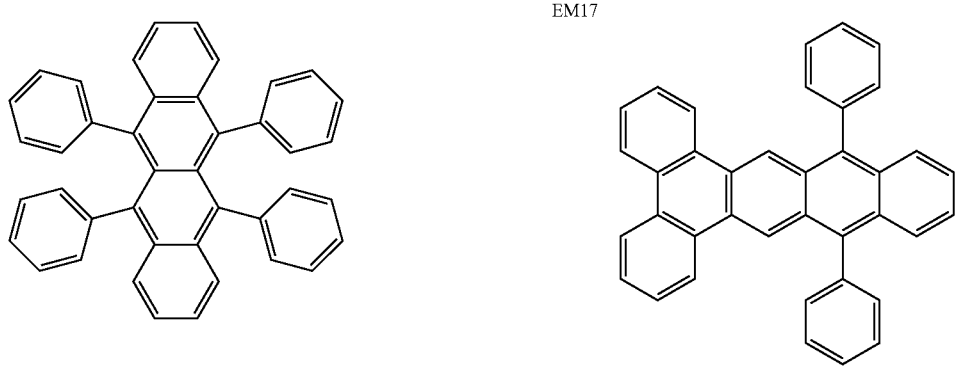
EM18
EM19
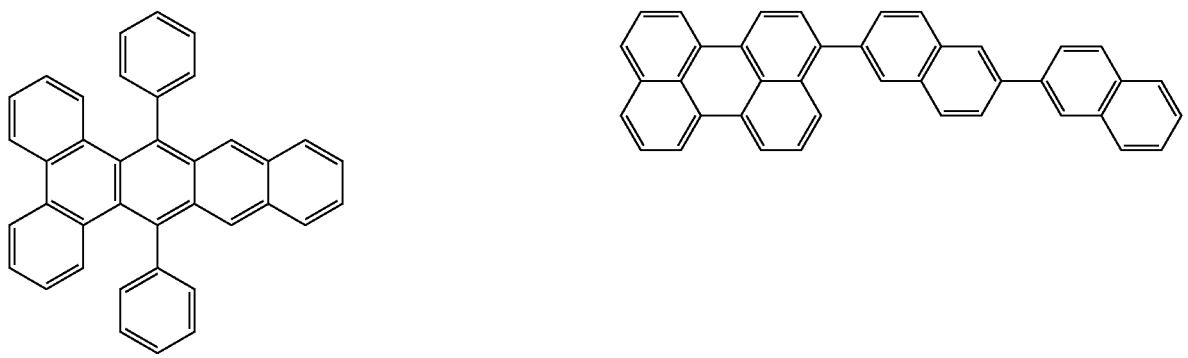
EM20
EM21
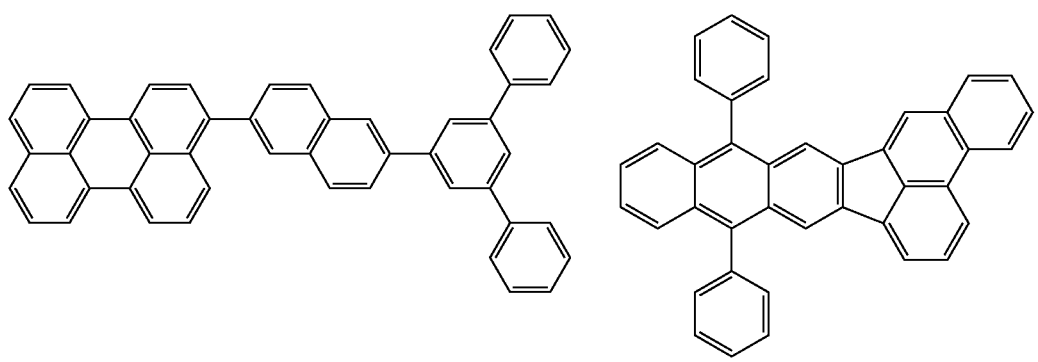
EM22

-continued
EM23
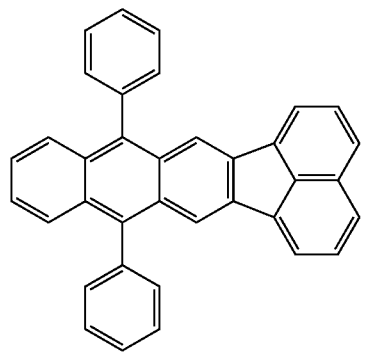
EM24
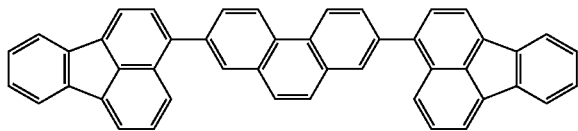
EM25
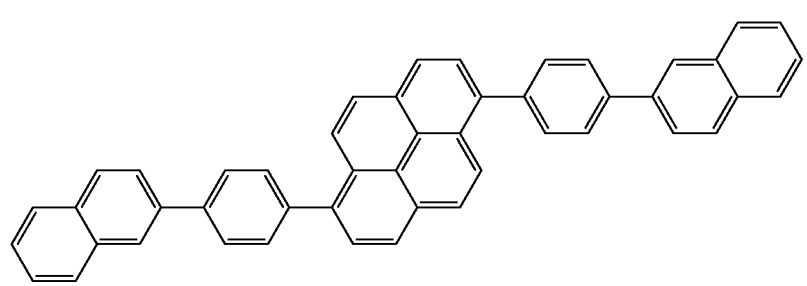
EM26
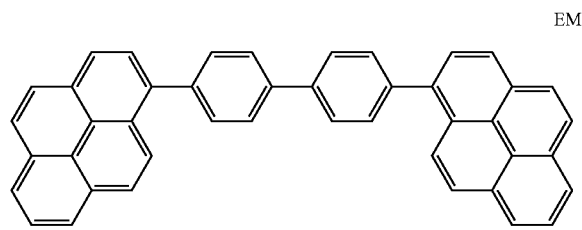
EM27
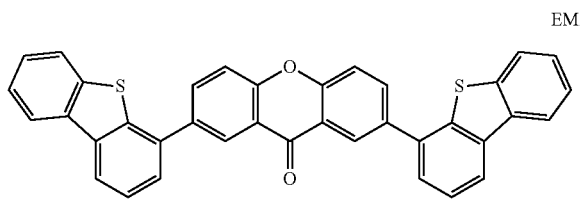
EM28
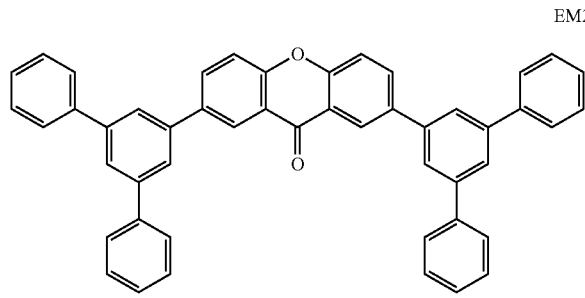
EM29
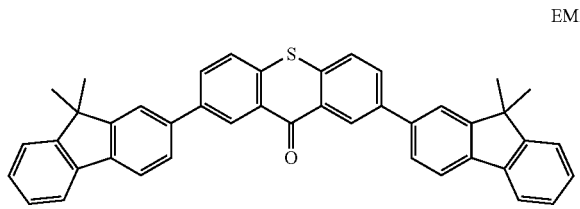
EM30
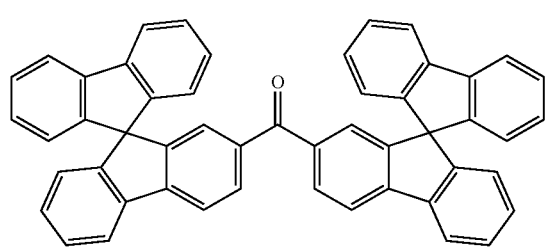
EM31
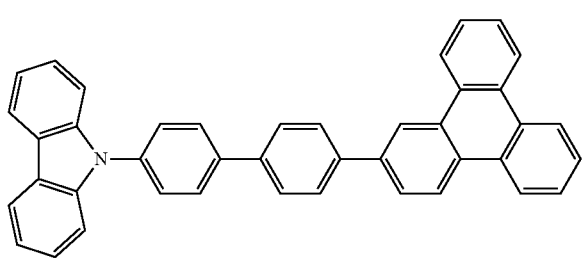

-continued

EM32

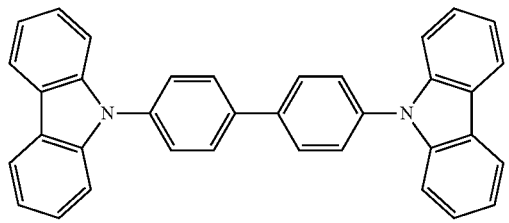

If the host material is a hydrocarbon compound, the compound according to the present invention can readily trap electrons or holes, and therefore, the effect of raising the efficiency becomes large. The hydrocarbon compound is a compound made of only carbon and hydrogen, and includes EM1 to EM12 and EM16 to EM27 in the compounds exemplified above.

The electron transport material can arbitrarily be selected from materials capable of transporting electrons injected from the cathode to the light emitting layer, and is selected in consideration of balance to the hole mobility of the hole transport material. Examples of the material having electron transport performance are an oxadiazole derivative, an oxazole derivative, a pyrazine derivative, a triazole derivative, a triazine derivative, a quinoline derivative, a quinoxaline derivative, a phenanthroline derivative, an organic aluminum complex, and condensed-ring compounds (for example, a fluorene derivative, a naphthalene derivative, a chrysene derivative, and an anthracene derivative). The above-described electron transport material can be used for the hole blocking layer as well.

Detailed examples of compounds used as the electron transport material will be shown below. The material is not limited to these, as a matter of course.

ET1

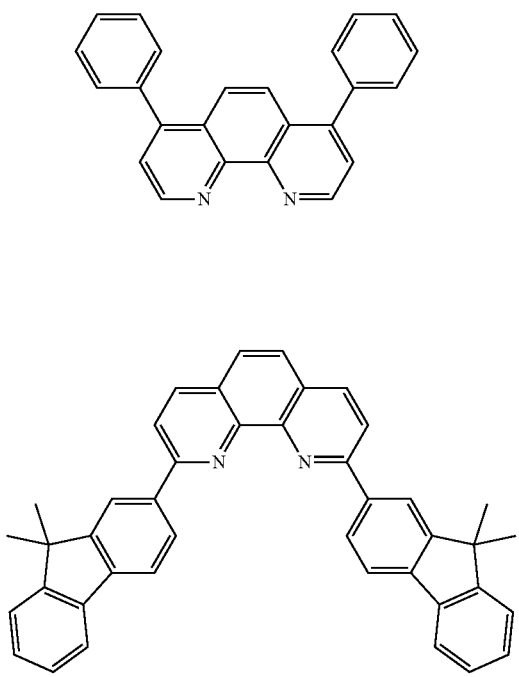

ET2

ET3

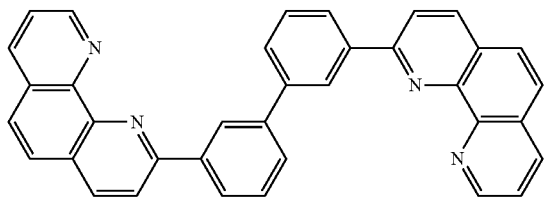

ET4

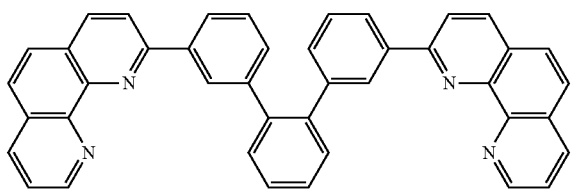

ET5

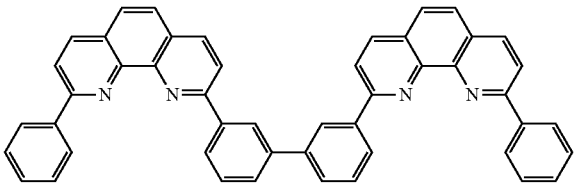

ET6

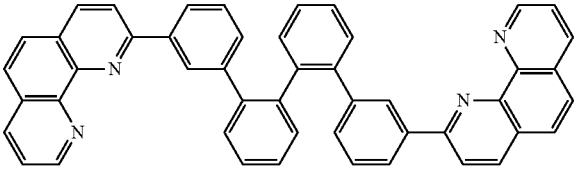

ET7

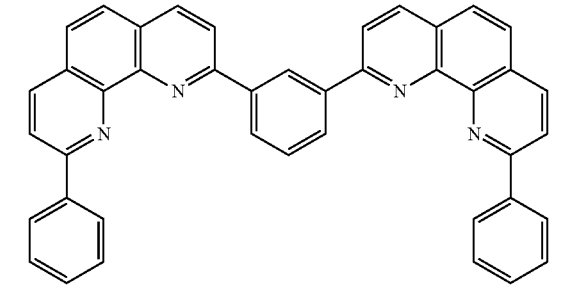

ET8
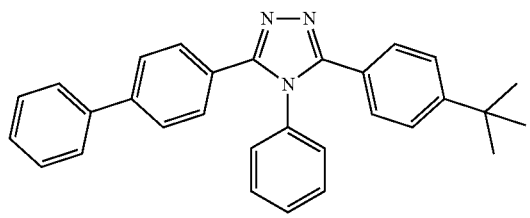
ET9
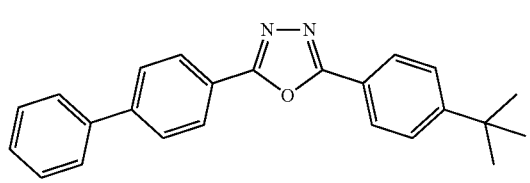
ET10
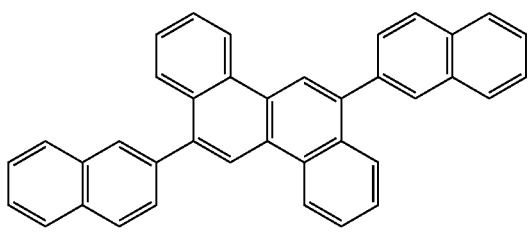
ET11
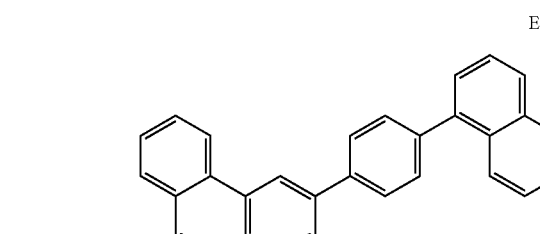
ET12
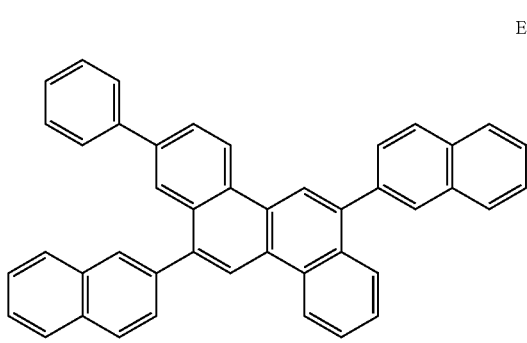
ET13
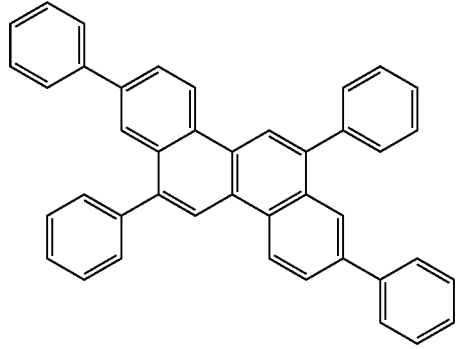
ET14
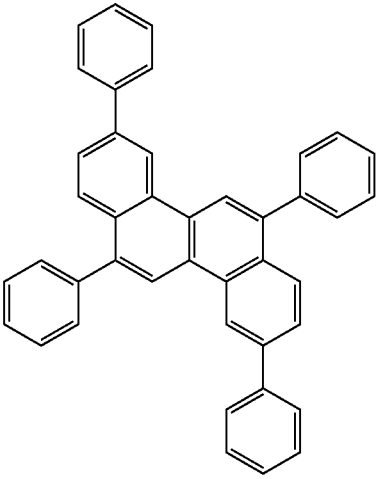
ET15
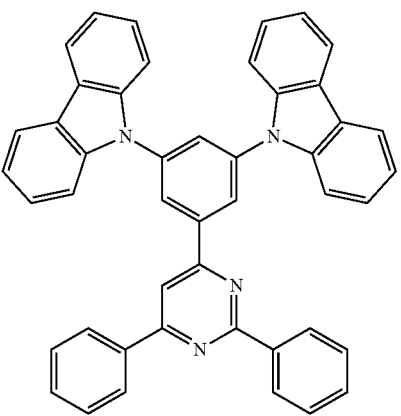

ET16
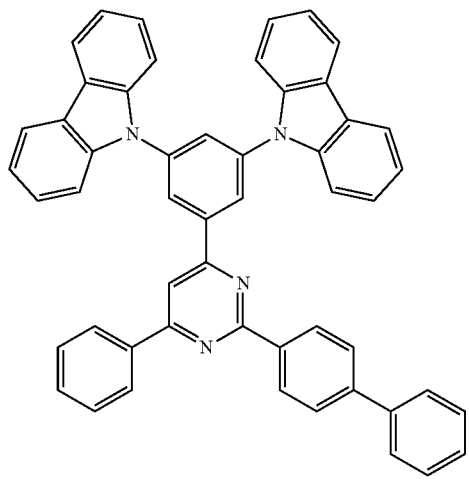

ET17
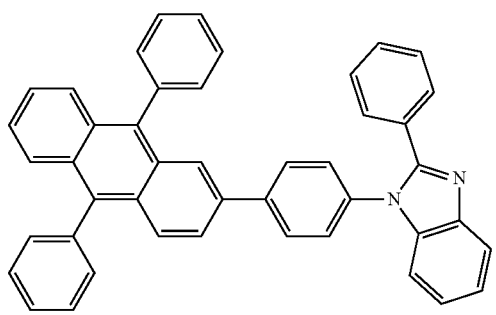

ET18
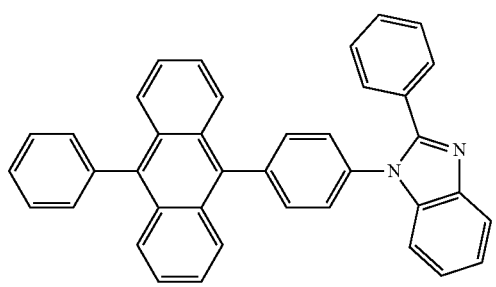

ET19
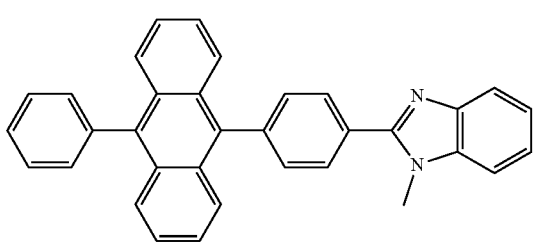

ET20
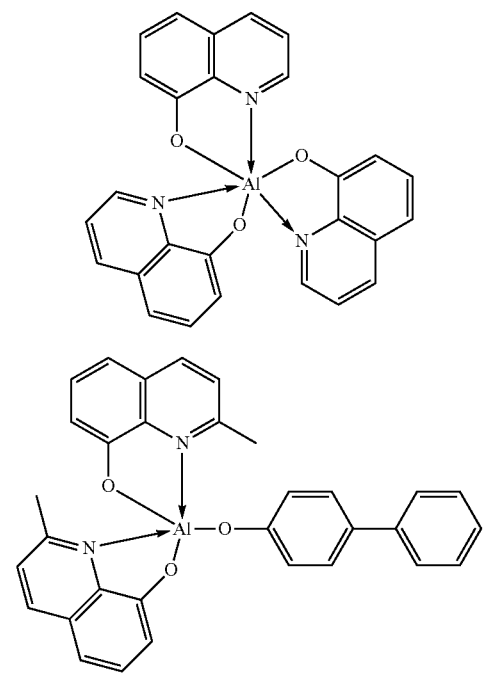

ET21

ET22
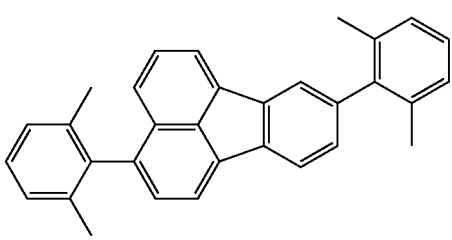

ET23
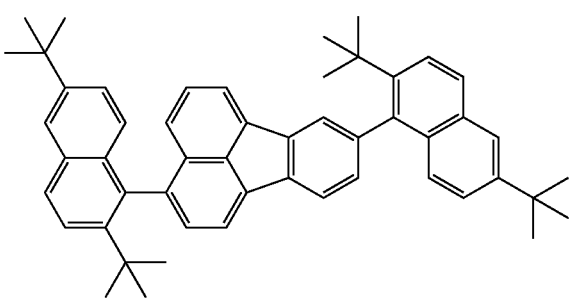

The electron injection material can arbitrarily be selected from materials capable of facilitating electron injection from the cathode, and is selected in consideration of balance to hole injection. The organic compound includes an n-type dopant and a reducible dopant. Examples are a compound containing an alkali metal such as lithium fluoride, a lithium complex such as a lithium-quinolinol complex, a benzoimidazolidene derivative, an imidazolidene derivative, a fulvalene derivative, and an acridine derivative.

The electron injection material can also be used together with the above-described electron transport material.

The organic light emitting element is formed by forming an insulating layer, a first electrode, an organic compound layer, and a second electrode on a substrate. A protection layer, a color filter, a microlens, and the like may be provided on a cathode. If a color filter is provided, a planarizing layer can be provided between the protection layer and the color filter. The planarizing layer can be made of acrylic resin or the like. The same applies to a case in which a planarizing layer is provided between the color filter and the microlens.

Quartz, glass, a silicon wafer, a resin, a metal, or the like may be used as a substrate. Furthermore, a switching element such as a transistor and a wiring may be provided on the substrate, and an insulating layer may be provided thereon. The insulating layer can be made of any material as long as a contact hole can be formed so that the wiring can be formed between the insulating layer and the first electrode and insulation from the unconnected wiring can be ensured. For example, a resin such as polyimide, silicon oxide, or silicon nitride can be used.

A pair of electrodes can be used as the electrodes. The pair of electrodes can be an anode and a cathode. If an electric field is applied in the direction in which the organic light emitting element emits light, the electrode having a high potential is the anode, and the other is the cathode. It can also be said that the electrode that supplies holes to the light emitting layer is the anode, and the electrode that supplies electrons is the cathode.

As the constituent material of the anode, a material having a work function as large as possible is used. For example, a metal such as gold, platinum, silver, copper, nickel, palladium, cobalt, selenium, vanadium, or tungsten, a mixture containing some of them, an alloy obtained by combining some of them, or a metal oxide such as tin oxide, zinc oxide, indium oxide, indium tin oxide (ITO), or zinc indium oxide can be used. Furthermore, a conductive polymer such as polyaniline, polypyrrole, or polythiophene can also be used.

One of these electrode materials may be used singly, or two or more of them may be used in combination. The anode may be formed by a single layer or a plurality of layers.

When the anode is used as a reflective electrode, for example, chromium, aluminum, silver, titanium, tungsten, molybdenum, an alloy thereof, a stacked layer thereof, or the like can be used. The above materials can function as a reflective film having no role as an electrode. When the anode is used as a transparent electrode, an oxide transparent conductive layer made of indium tin oxide (ITO), indium zinc oxide, or the like can be used, but the present invention is not limited thereto. A photolithography technique can be used to form the electrode.

On the other hand, as the constituent material of the cathode, a material having a small work function is used. Examples of the material include an alkali metal such as lithium, an alkaline earth metal such as calcium, a metal such as aluminum, titanium, manganese, silver, lead, or chromium, and a mixture containing some of them. Alternatively, an alloy obtained by combining these metals can also be used. For example, a magnesium-silver alloy, an aluminum-lithium alloy, an aluminum-magnesium alloy, a silver-copper alloy, a zinc-silver alloy, or the like can be used. A metal oxide such as indium tin oxide (ITO) can also be used. One of these electrode materials may be used singly, or two or more of them may be used in combination. The cathode may have a single-layer structure or a multilayer structure. In particular, silver may be used. To suppress aggregation of silver, a silver alloy may be used. The ratio of the alloy is not limited as long as aggregation of silver can be suppressed. For example, the ratio between silver and another metal may be 1:1, 3:1, or the like.

The cathode may be a top emission element using an oxide conductive layer made of ITO or the like, or may be a bottom emission element using a reflective electrode made of aluminum (Al) or the like, and is not particularly limited.

The method of forming the cathode is not particularly limited, but direct current sputtering or alternating current sputtering is used to provide the good film coverage and easily lower the resistance.

The organic compound layer may be formed by a single layer or a plurality of layers. If the organic compound layer includes a plurality of layers, the layers can be called a hole injection layer, a hole transport layer, an electron blocking layer, a light emitting layer, a hole blocking layer, an electron transport layer, and an electron injection layer in accordance with the functions of the layers. The organic compound layer is mainly formed from an organic compound but may contain inorganic atoms and an inorganic compound. For example, the organic compound layer may contain copper, lithium, magnesium, aluminum, iridium, platinum, molybdenum, zinc, or the like. The organic compound layer can be arranged between the first and second electrodes, and may be arranged in contact with the first and second electrodes.

A protection layer may be provided on the cathode. For example, by adhering glass provided with a moisture absorbing agent on the cathode, permeation of water or the like into the organic compound layer can be suppressed and occurrence of display defects can be suppressed. Furthermore, as another embodiment, a passivation film made of silicon nitride or the like may be provided on the cathode to suppress permeation of water or the like into the organic compound layer. For example, the protection layer can be formed by forming the cathode, transferring it to another chamber without breaking the vacuum, and forming a silicon nitride film having a thickness of 2 µm by the CVD method. The protection layer may be provided using an atomic deposition method (ALD method) after forming a film using the CVD method. The material of the film by the ALD method is not limited but can be silicon nitride, silicon oxide, aluminum oxide, or the like. A silicon nitride film may further be formed by the CVD method on the film formed by the ALD method. The film formed by the ALD method may have a film thickness smaller than that of the film formed by the CVD method. More specifically, the film thickness of the film formed by the ALD method may be 50% or less, or 10% or less.

A color filter may be provided on the protection layer. For example, a color filter considering the size of the organic light emitting element may be provided on another substrate, and this substrate may be bonded to the substrate with the organic light emitting element provided thereon. Alternatively, a color filter may be patterned on the above-described protection layer using a photolithography technique. The color filter can be formed from a polymeric material.

A planarizing layer may be provided between the color filter and the protection layer. The planarizing layer is provided to reduce unevenness of the lower layer. The planarizing layer may be called a material resin layer without limiting the purpose of the layer. The planarizing layer can be formed from an organic compound, and can be made of a low-molecular material or a polymeric material. The polymeric material is more suitable.

The planarizing layers may be provided above and below the color filter, and the same or different materials may be used for them. More specifically, examples of the material include polyvinyl carbazole resin, polycarbonate resin, polyester resin, ABS resin, acrylic resin, polyimide resin, phenol resin, epoxy resin, silicone resin, and urea resin.

The organic light emitting device can include an optical member such as a microlens on the light emission side. The microlens can be made of acrylic resin, epoxy resin, or the like. The microlens can aim to increase the amount of light extracted from the organic light emitting device and control the direction of light to be extracted. The microlens can have a hemispherical shape. If the microlens has a hemispherical shape, among tangents contacting the hemisphere, there is a tangent parallel to the insulating layer, and the contact between the tangent and the hemisphere is the vertex of the microlens. The vertex of the microlens can be decided in the same manner even in an arbitrary sectional view. That is, among tangents contacting the semicircle of the microlens in a sectional view, there is a tangent parallel to the insulating layer, and the contact between the tangent and the semicircle is the vertex of the microlens.

Furthermore, the middle point of the microlens can also be defined. In the section of the microlens, a line segment from a point at which an arc shape ends to a point at which another arc shape ends is assumed, and the middle point of the line segment can be called the middle point of the microlens. A section for determining the vertex and the middle point may be a section perpendicular to the insulating layer.

A counter substrate can be provided on the planarizing layer. The counter substrate is called a counter substrate because it is provided at a position corresponding to the above-described substrate. The constituent material of the counter substrate can be the same as that of the above-described substrate. When the above-described substrate is the first substrate, the counter substrate can be the second substrate.

The organic compound layer (hole injection layer, hole transport layer, electron blocking layer, light emitting layer, hole blocking layer, electron transport layer, electron injection layer, and the like) forming the organic light emitting element according to an embodiment of the present invention is formed by the method to be described below.

The organic compound layer forming the organic light emitting element according to the embodiment of the present invention can be formed by a dry process using a vacuum deposition method, an ionization deposition method, a sputtering method, a plasma method, or the like. Instead of the dry process, a wet process that forms a layer by dissolving a solute in an appropriate solvent and using a well-known coating method (for example, a spin coating method, a dipping method, a casting method, an LB method, an inkjet method, or the like) can be used.

Here, when the layer is formed by a vacuum deposition method, a solution coating method, or the like, crystallization or the like hardly occurs and excellent temporal stability is obtained. Furthermore, when the layer is formed using a coating method, it is possible to form the film in combination with a suitable binder resin.

Examples of the binder resin include polyvinyl carbazole resin, polycarbonate resin, polyester resin, ABS resin, acrylic resin, polyimide resin, phenol resin, epoxy resin, silicone resin, and urea resin. However, the binder resin is not limited to them.

One of these binder resins may be used singly as a homopolymer or a copolymer, or two or more of them may be used in combination. Furthermore, additives such as a well-known plasticizer, antioxidant, and an ultraviolet absorber may also be used as needed.

The light emitting device can include a pixel circuit connected to the light emitting element. The pixel circuit may be an active matrix circuit that individually controls light emission of the first and second light emitting elements. The active matrix circuit may be a voltage or current programming circuit. A driving circuit includes a pixel circuit for each pixel. The pixel circuit can include a light emitting element, a transistor for controlling light emission brightness of the light emitting element, a transistor for controlling a light emission timing, a capacitor for holding the gate voltage of the transistor for controlling the light emission brightness, and a transistor for connection to GND without intervention of the light emitting element.

The light emitting device includes a display region and a peripheral region arranged around the display region. The light emitting device includes the pixel circuit in the display region and a display control circuit in the peripheral region. The mobility of the transistor forming the pixel circuit may be smaller than that of a transistor forming the display control circuit.

The slope of the current-voltage characteristic of the transistor forming the pixel circuit may be smaller than that of the current-voltage characteristic of the transistor forming the display control circuit. The slope of the current-voltage characteristic can be measured by a so-called Vg-Ig characteristic.

The transistor forming the pixel circuit is a transistor connected to the light emitting element such as the first light emitting element.

The organic light emitting device includes a plurality of pixels. Each pixel includes sub-pixels that emit light components of different colors. The sub-pixels include, for example, R, G, and B emission colors, respectively.

In each pixel, a region also called a pixel opening emits light. This region is the same as the first region. The pixel opening can have a size of 5 μm (inclusive) to 15 μm (inclusive). More specifically, the pixel opening can have a size of 11 μm, 9.5 μm, 7.4 μm, 6.4 μm, or the like.

A distance between the sub-pixels can be 10 μm or less, and can be, more specifically, 8 μm, 7.4 μm, or 6.4 μm.

The pixels can have a known arrangement form in a plan view. For example, the pixels may have a stripe arrangement, a delta arrangement, a pentile arrangement, or a Bayer arrangement. The shape of each sub-pixel in a plan view may be any known shape. For example, a quadrangle such as a rectangle or a rhombus, a hexagon, or the like may be possible. A shape which is not a correct shape but is close to a rectangle is included in a rectangle. The shape of the sub-pixel and the pixel arrangement can be used in combination.

The organic light emitting element according to an embodiment of the present invention can be used as a constituent member of a display device or an illumination device. In addition, the organic light emitting element is applicable to the exposure light source of an electrophotographic image forming device, the backlight of a liquid crystal display device, a light emitting device including a color filter in a white light source, and the like.

The display device may be an image information processing device that includes an image input unit for inputting image information from an area CCD, a linear CCD, a memory card, or the like, and an information processing unit for processing the input information, and displays the input image on a display unit.

In addition, a display unit included in an image capturing device or an inkjet printer can have a touch panel function. The driving type of the touch panel function may be an infrared type, a capacitance type, a resistive film type, or an electromagnetic induction type, and is not particularly limited. The display device may be used for the display unit of a multifunction printer.

The light emitting device according to the embodiment will be described next with reference to the accompanying drawings.

FIGS. 9A and 9B are schematic sectional views showing an example of the light emitting device including the organic light emitting element and the transistor connected to it. The transistor is an example of an active element. The transistor may be a thin-film transistor (TFT).

FIG. 9A shows an example of a pixel as a constituent element of the light emitting device according to this embodiment. The pixel includes sub-pixels 810. The sub-pixels are divided into sub-pixels 810R, 810G, and 810B by emitted light components. The light emission colors may be discriminated by wavelengths of light components emitted from the light emitting layers, or light emitted from each sub-pixel may be selectively transmitted or undergo color conversion by a color filter or the like. Each sub-pixel includes a reflective electrode 802 as the first electrode on an interlayer dielectric layer 801, an insulating layer 803 covering the end of the reflective electrode 802, an organic compound layer 804 covering the first electrode and the insulating layer, a transparent electrode 805 as the second electrode, a protection layer 806, and a color filter 807.

The interlayer dielectric layer 801 can include a transistor and a capacitive element arranged in the interlayer dielectric layer 801 or a layer below it. The transistor and the first electrode can electrically be connected via a contact hole (not shown) or the like.

The insulating layer 803 is also called a bank or a pixel separation film. The insulating layer 803 covers the end of the first electrode, and is arranged to surround the first electrode. A portion where no insulating layer is arranged contacts the organic compound layer 804 to form a light emission region.

The organic compound layer 804 includes a hole injection layer 841, a hole transport layer 842, a first light emitting layer 843, a second light emitting layer 844, and an electron transport layer 845.

The second electrode may be a transparent electrode, a reflective electrode, or a translucent electrode.

The protection layer 806 suppresses permeation of water into the organic compound layer. The protection layer is shown as a single layer but may include a plurality of layers. Each layer can be an inorganic compound layer or an organic compound layer.

The color filter 807 is divided into color filters 807R, 807G, and 807B by colors. The color filters can be formed on the planarizing layer (not shown). A resin protection layer (not shown) can be provided on the color filters. The color filters can be formed on the protection layer 806. Alternatively, the color filters can be provided on the counter substrate such as a glass substrate, and then the substrate may be bonded.

A light emitting device 800 shown in FIG. 9B is provided with an organic light emitting element 826 and a TFT 818 as an example of a transistor. A substrate 811 of glass, silicon, or the like is provided and an insulating layer 812 is provided on the substrate 811. The active element such as the TFT 818 is arranged on the insulating layer, and a gate electrode 813, a gate insulating film 814, and a semiconductor layer 815 of the active element are arranged. The TFT 818 further includes the semiconductor layer 815, a drain electrode 816, and a source electrode 817. An insulating film 819 is provided on the TFT 818. The source electrode 817 and an anode 821 forming the organic light emitting element 826 are connected via a contact hole 820 formed in the insulating film.

Note that a method of electrically connecting the electrodes (anode and cathode) included in the organic light emitting element 826 and the electrodes (source electrode and drain electrode) included in the TFT is not limited to that shown in FIG. 9B. That is, one of the anode and cathode and one of the source electrode and drain electrode of the TFT are electrically connected. The TFT indicates a thin-film transistor.

In the light emitting device 800 shown in FIG. 9B, an organic compound layer is illustrated as one layer. However, an organic compound layer 822 may include a plurality of layers. A first protection layer 824 and a second protection layer 825 are provided on a cathode 823 to suppress the degradation of the organic light emitting element.

A transistor is used as a switching element in the light emitting device 800 shown in FIG. 9B but may be used as another switching element.

The transistor used in the light emitting device 800 shown in FIG. 9B is not limited to a transistor using a single-crystal silicon wafer, and may be a thin-film transistor including an active layer on an insulating surface of a substrate. Examples of the active layer include single-crystal silicon, amorphous silicon, non-single-crystal silicon such as microcrystalline silicon, and a non-single-crystal oxide semiconductor such as indium zinc oxide and indium gallium zinc oxide. Note that a thin-film transistor is also called a TFT element.

The transistor included in the light emitting device 800 shown in FIG. 9B may be formed in the substrate such as an Si substrate. Forming the transistor in the substrate means forming the transistor by processing the substrate such as an Si substrate. That is, when the transistor is included in the substrate, it can be considered that the substrate and the transistor are formed integrally.

The light emission brightness of the organic light emitting element according to this embodiment can be controlled by the TFT which is an example of a switching element, and the plurality of organic light emitting elements can be provided in planes to display an image with the light emission brightness of the respective elements. Note that the switching element according to this embodiment is not limited to the TFT, and may be a transistor formed from low-temperature polysilicon or an active matrix driver formed on the substrate such as an Si substrate. The term "on the substrate" may mean "in the substrate". Whether to provide a transistor in the substrate or use a TFT is selected based on the size of the display unit. For example, if the size is about 0.5 inch, the organic light emitting element can be provided on the Si substrate.

Figure 10A:
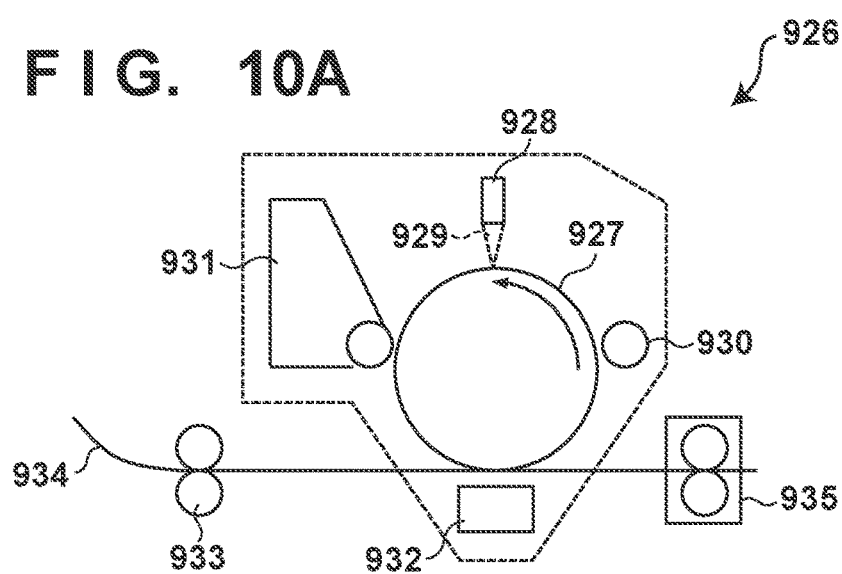
FIGS. 10A to 10C are views showing an example of an image forming device using the light emitting device according to the embodiment.
Figure 10B:
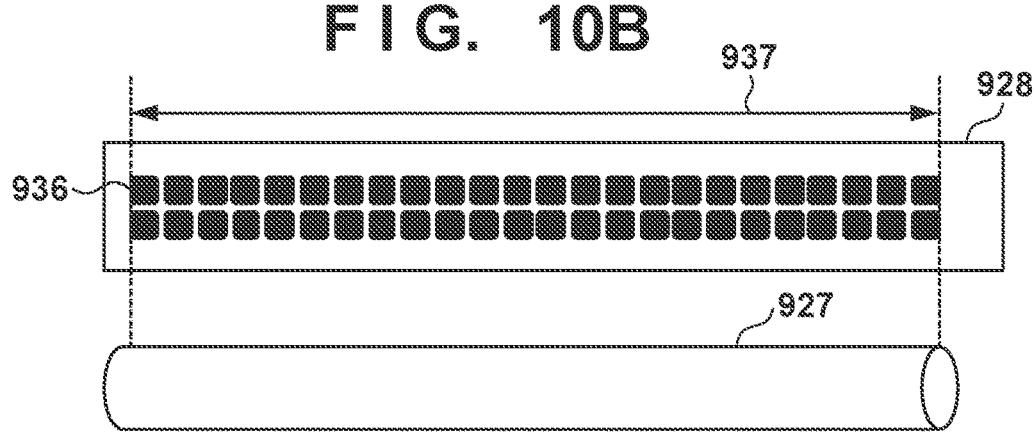
Figure 10C:
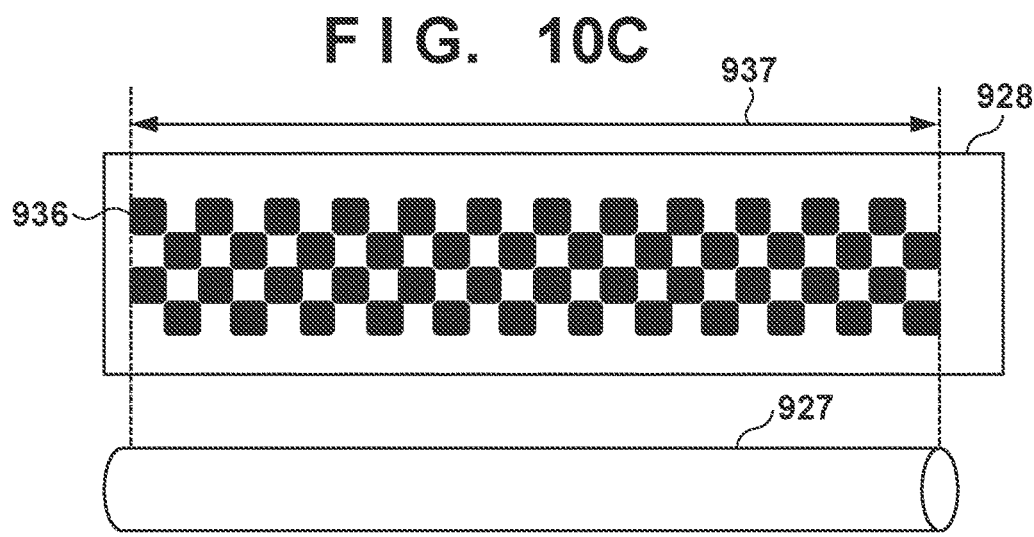

FIGS. 10A to 10C are schematic views showing an example of an image forming device using the light emitting device 100 of this embodiment. An image forming device 926 shown in FIG. 10A includes a photosensitive member 927, an exposure light source 928, a developing unit 931, a charging unit 930, a transfer device 932, a conveyance unit 933 (a conveyance roller in the configuration shown in FIG. 10A), and a fixing device 935.

Light 929 is emitted from the exposure light source 928, and an electrostatic latent image is formed on the surface of the photosensitive member 927. The light emitting device 100 according to this embodiment can be applied to the exposure light source 928. The developing unit 931 can function as a developing device that includes a toner or the like as a developing agent and applies the developing agent to the exposed photosensitive member 927. The charging unit 930 charges the photosensitive member 927. The transfer device 932 transfers the developed image to a print medium 934. The conveyance unit 933 conveys the print medium 934. The print medium 934 can be, for example, paper or a film. The fixing device 935 fixes the image formed on the print medium.

Each of FIGS. 10B and 10C is a schematic view showing a plurality of light emitting units 936 arranged in the exposure light source 928 along the longitudinal direction of a long substrate. The light emitting device 100 according to this embodiment can be applied to each of the light emitting units 936. That is, the light emitting elements 120 arranged in the sub-pixels 151 of the plurality of pixels 150 arranged in the display region 201 are arranged along the longitudinal direction of the substrate. A direction 937 is a direction parallel to the axis of the photosensitive member 927. This column direction matches the direction of the axis upon rotating the photosensitive member 927. This direction 937 can also be referred to as the long-axis direction of the photosensitive member 927.

FIG. 10B shows a form in which the light emitting units 936 are arranged along the long-axis direction of the photosensitive member 927. FIG. 10C shows a form, which is a modification of the arrangement of the light emitting units 936 shown in FIG. 10B, in which the light emitting units 936 are arranged in the column direction alternately between the first column and the second column. The light emitting units 936 are arranged at different positions in the row direction between the first column and the second column. In the first column, the plurality of light emitting units 936 are arranged spaced apart from each other. In the second column, the light emitting unit 936 is arranged at the position corresponding to the space between the light emitting units 936 in the first column. Furthermore, in the row direction, the plurality of light emitting units 936 are arranged spaced apart from each other. The arrangement of the light emitting units 936 shown in FIG. 10C can be referred to as, for example, an arrangement in a grid pattern, an arrangement in a staggered pattern, or an arrangement in a checkered pattern.

Figure 11:
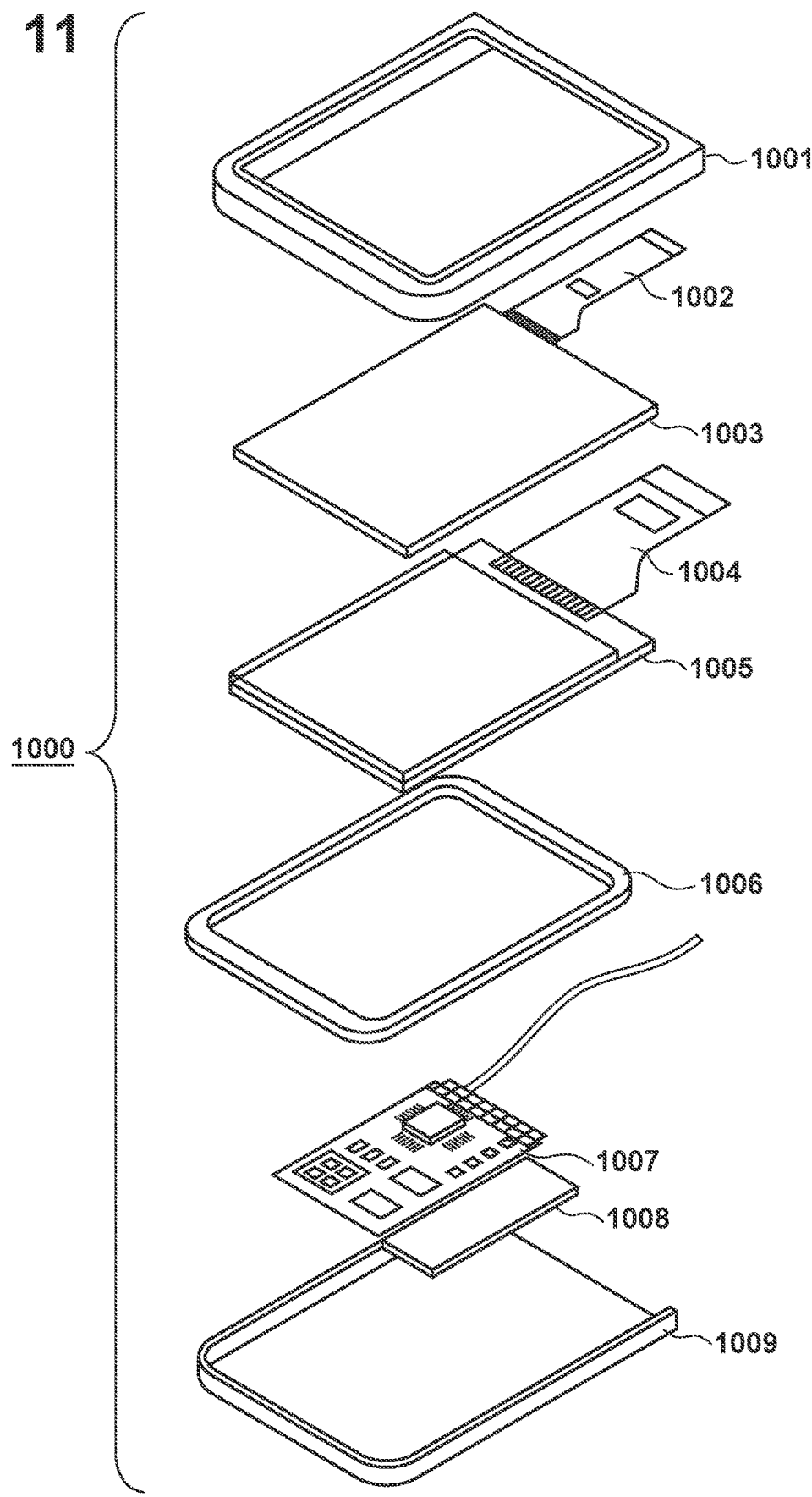
FIG. 11 is a view showing an application example of the light emitting device according to the embodiment.

FIG. 11 is a schematic view showing an example of the display device using the light emitting device 100 of this embodiment. A display device 1000 can include a touch panel 1003, a display panel 1005, a frame 1006, a circuit board 1007, and a battery 1008 between an upper cover 1001 and a lower cover 1009. Flexible printed circuits (FPCs) 1002 and 1004 are respectively connected to the touch panel 1003 and the display panel 1005. Active elements such as transistors are arranged on the circuit board 1007. The battery 1008 is unnecessary if the display device 1000 is not a portable apparatus. Even when the display device 1000 is a portable apparatus, the battery 1008 need not be provided at this position. The light emitting device 100 according to this embodiment can be applied to the display panel 1005. The display region 201 of the light emitting device 100 functioning as the display panel 1005 is connected to the active elements such as transistors arranged on the circuit board 1007 and operates.

The display device 1000 shown in FIG. 11 can be used for a display unit of a photoelectric conversion device (image capturing device) including an optical unit having a plurality of lenses, and an image sensor for receiving light having passed through the optical unit and photoelectrically converting the light into an electric signal. The photoelectric conversion device can include a display unit for displaying information acquired by the image sensor. In addition, the display unit can be either a display unit exposed outside the photoelectric conversion device, or a display unit arranged in the finder. The photoelectric conversion device can be a digital camera or a digital video camera.

Figure 12:
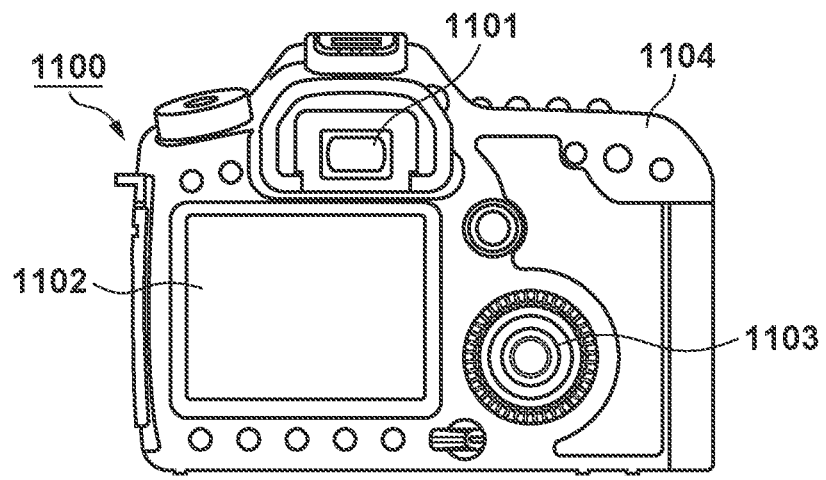
FIG. 12 is a view showing an example of a photoelectric conversion device using the light emitting device according to the embodiment.

FIG. 12 is a schematic view showing an example of the photoelectric conversion device using the light emitting device 100 of this embodiment. A photoelectric conversion device 1100 can include a viewfinder 1101, a rear display 1102, an operation unit 1103, and a housing 1104. The photoelectric conversion device 1100 can also be called an image capturing device. The light emitting device 100 according to this embodiment can be applied to the viewfinder 1101 as a display unit. In this case, the light emitting device 100 can display not only an image to be captured but also environment information, image capturing instructions, and the like. Examples of the environment information are the intensity and direction of external light, the moving velocity of an object, and the possibility that an object is covered with an obstacle.

The timing suitable for image capturing is a very short time in many cases, so it is better to display the information as quickly as possible. Therefore, the light emitting device 100 containing the organic light emitting material such as an organic EL element in the light emitting layer can be used for the viewfinder 1101. This is so because the organic light emitting material has a high response speed. The light emitting device 100 using the organic light emitting material can be used more suitably than a liquid crystal display apparatus in the apparatuses that require a high display speed.

The photoelectric conversion device 1100 includes an optical unit (not shown). This optical unit has a plurality of lenses, and forms an image on a photoelectric conversion element (not shown) that receives light having passed through the optical unit and is accommodated in the housing 1104. The focal points of the plurality of lenses can be adjusted by adjusting the relative positions. This operation can also automatically be performed.

The light emitting device 100 may be applied to a display unit of an electronic apparatus. At this time, the display unit can have both a display function and an operation function. Examples of the portable terminal are a portable phone such as a smartphone, a tablet, and a head mounted display.

Figure 13:
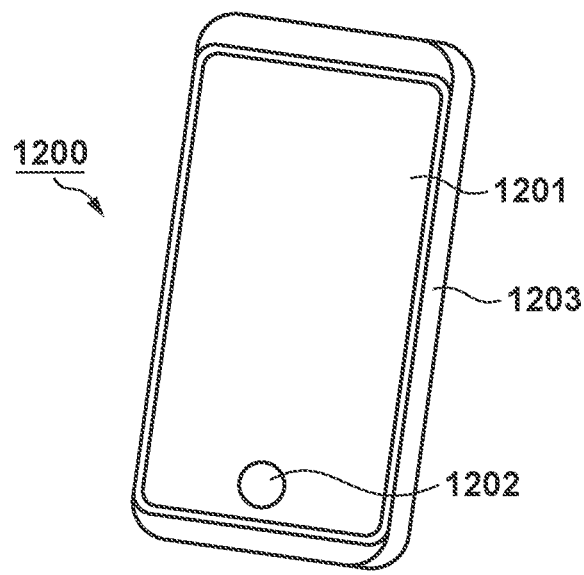
FIG. 13 is a view showing an example of an electronic apparatus using the light emitting device according to the embodiment.

FIG. 13 is a schematic view showing an example of an electronic apparatus using the light emitting device 100 of this embodiment. An electronic apparatus 1200 includes a display unit 1201, an operation unit 1202, and a housing 1203. The housing 1203 can accommodate a circuit, a printed board having this circuit, a battery, and a communication unit. The operation unit 1202 can be a button or a touch-panel-type reaction unit. The operation unit 1202 can also be a biometric authentication unit that performs unlocking or the like by authenticating the fingerprint. The portable apparatus including the communication unit can also be regarded as a communication apparatus. The light emitting device 100 according to this embodiment can be applied to the display unit 1201.

Figure 14A:
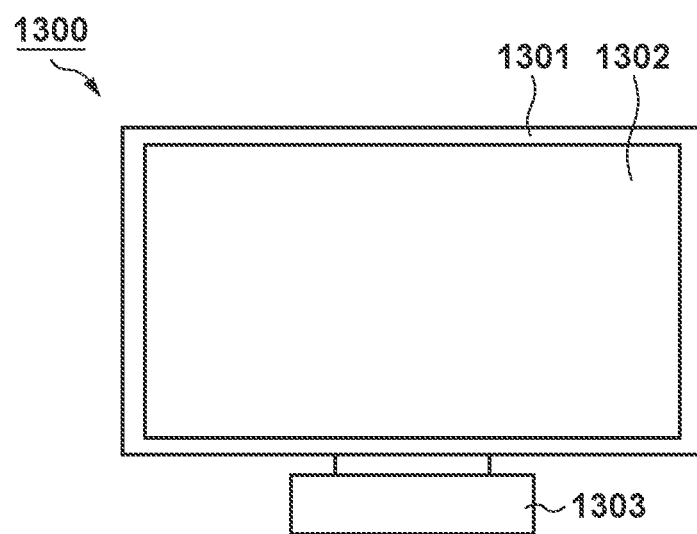
FIGS. 14A and 14B are view showing an application example of the light emitting device according to the embodiment.
Figure 14B:
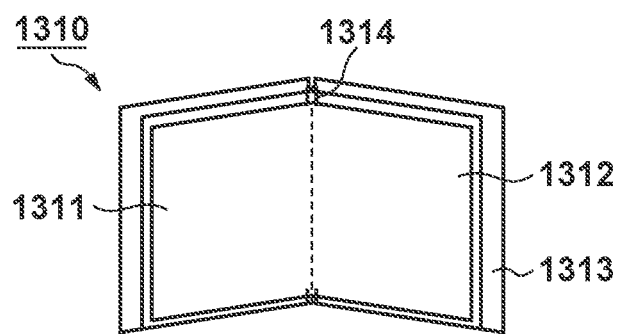

FIGS. 14A and 14B are schematic views showing examples of the display device using the light emitting device 100 of this embodiment. FIG. 14A shows a display device such as a television monitor or a PC monitor. A display device 1300 includes a frame 1301 and a display unit 1302. The light emitting device 100 according to this embodiment can be applied to the display unit 1302. The display device 1300 can include a base 1303 that supports the frame 1301 and the display unit 1302. The base 1303 is not limited to the form shown in FIG. 14A. For example, the lower side of the frame 1301 may also function as the base 1303. In addition, the frame 1301 and the display unit 1302 can be bent. The radius of curvature in this case can be 5,000 mm (inclusive) to 6,000 mm (inclusive).

FIG. 14B is a schematic view showing another example of the display device using the light emitting device 100 of this embodiment. A display device 1310 shown in FIG. 14B can be folded, and is a so-called foldable display device. The display device 1310 includes a first display unit 1311, a second display unit 1312, a housing 1313, and a bending point 1314. The light emitting device 100 according to this embodiment can be applied to each of the first display unit 1311 and the second display unit 1312. The first display unit 1311 and the second display unit 1312 can also be one seamless display device. The first display unit 1311 and the second display unit 1312 can be divided by the bending point. The first display unit 1311 and the second display unit 1312 can display different images, and can also display one image together.

Figure 15:
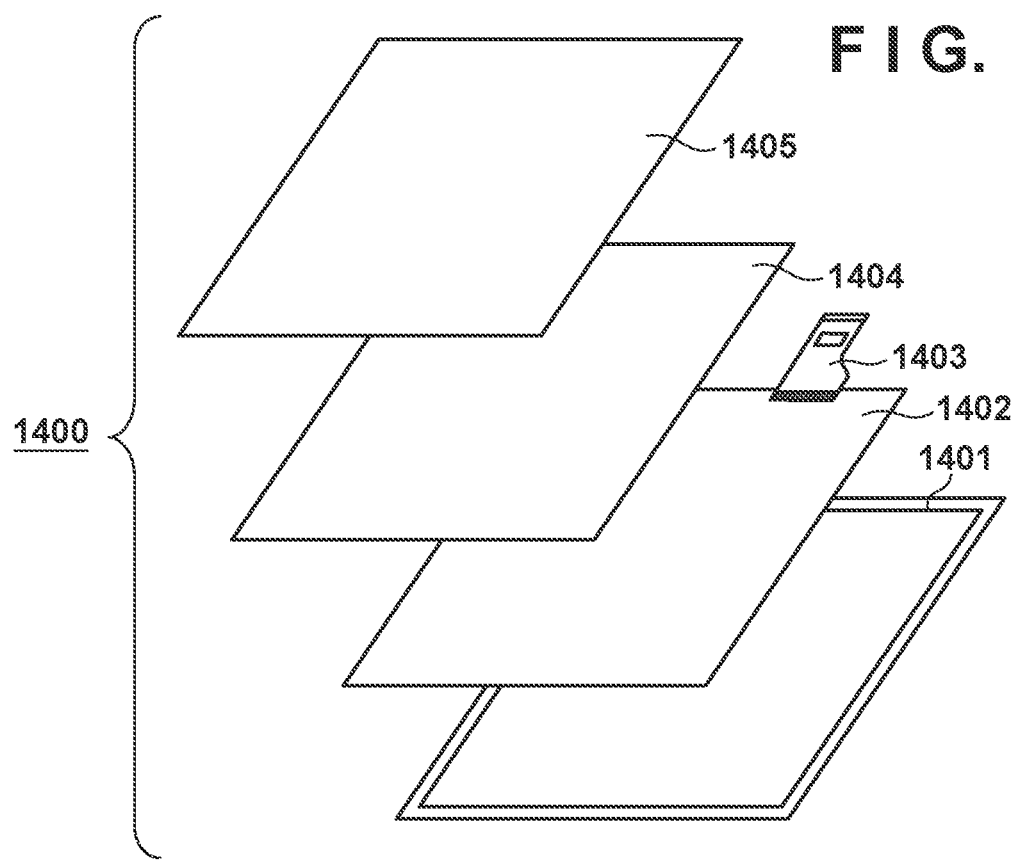
FIG. 15 is a view showing an example of an illumination device using the light emitting device according to the embodiment.

FIG. 15 is a schematic view showing an example of the illumination device using the light emitting device 100 of this embodiment. An illumination device 1400 can include a housing 1401, a light source 1402, a circuit board 1403, an optical film 1404, and a light diffusing unit 1405. The light emitting device 100 containing according to this embodiment can be applied to the light source 1402. The optical film 1404 can be a filter that improves the color rendering of the light source. When performing lighting-up or the like, the light diffusing unit 1405 can throw the light of the light source over a broad range by effectively diffusing the light. The illumination device can also include a cover on the outermost portion, as needed. The illumination device 1400 can include both or one of the optical film 1404 and the light diffusing unit 1405.

The illumination device 1400 is, for example, a device for illuminating the interior of the room. The illumination device 1400 can emit white light, natural white light, or light of any color from blue to red. The illumination device 1400 can also include a light control circuit for controlling these light components. The illumination device 1400 can also include a power supply circuit connected to the light emitting device 100 functioning as the light source 1402. The power supply circuit is a circuit for converting an AC voltage into a DC voltage. White has a color temperature of 4,200 K, and natural white has a color temperature of 5,000 K. The illumination device 1400 may also include a color filter. In addition, the illumination device 1400 can include a heat radiation unit. The heat radiation unit radiates the internal heat of the device to the outside of the device, and examples are a metal having a high specific heat and liquid silicon.

Figure 16:
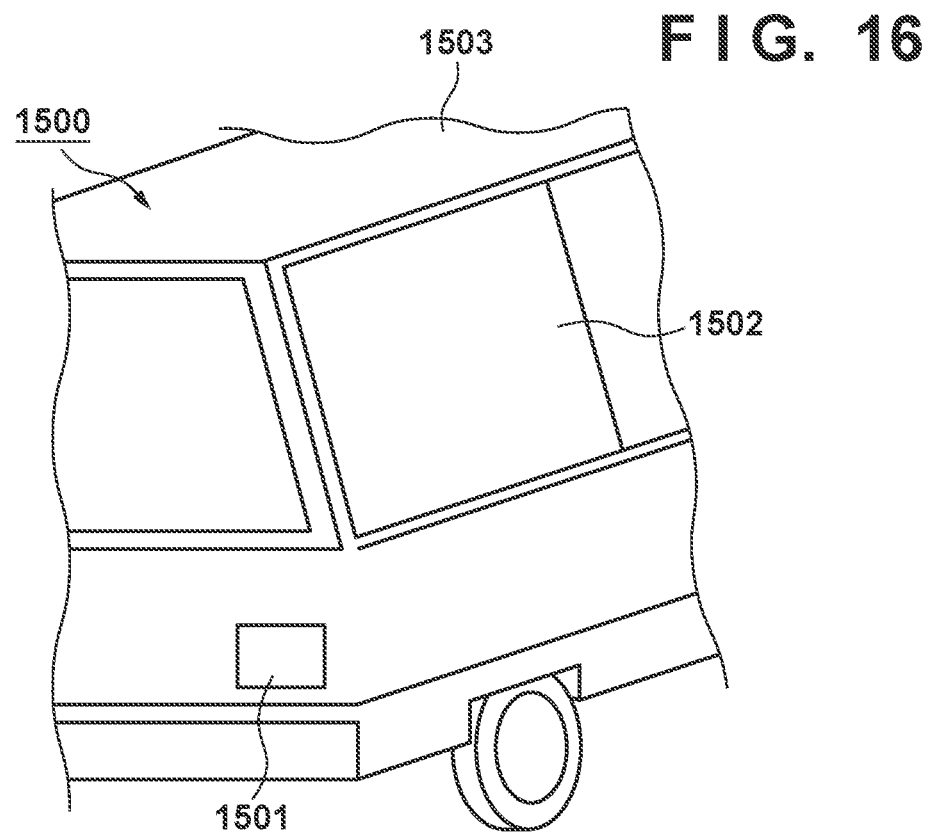
FIG. 16 is a view showing an example of a moving body using the light emitting device according to the embodiment.

FIG. 16 is a schematic view of an automobile having a taillight as an example of a vehicle lighting appliance using the light emitting device 100 of this embodiment. An automobile 1500 has a taillight 1501, and can have a form in which the taillight 1501 is turned on when performing a braking operation or the like. The light emitting device 100 of this embodiment can be used as a headlight serving as a vehicle lighting appliance. The automobile is an example of a moving body, and the moving body may be a ship, a drone, an aircraft, a railroad car, an industrial robot, or the like. The moving body may include a main body and a lighting appliance provided in the main body. The lighting appliance may be used to make a notification of the current position of the main body.

The light emitting device 100 according to this embodiment can be applied to the taillight 1501. The taillight 1501 can include a protection member for protecting the light emitting device 100 functioning as the taillight 1501. The material of the protection member is not limited as long as the material is a transparent material with a strength that is high to some extent, and an example is polycarbonate. A furandicarboxylic acid derivative, an acrylonitrile derivative, or the like may be mixed in polycarbonate.

The automobile 1500 can include a vehicle body 1503, and a window 1502 attached to the vehicle body 1503. This window can be a window for checking the front and back of the automobile, and can also be a transparent display. For this transparent display, the light emitting device 100 according to this embodiment may be used. In this case, the constituent materials of the electrodes and the like of the light emitting device 100 are formed by transparent members.

Figure 17A:
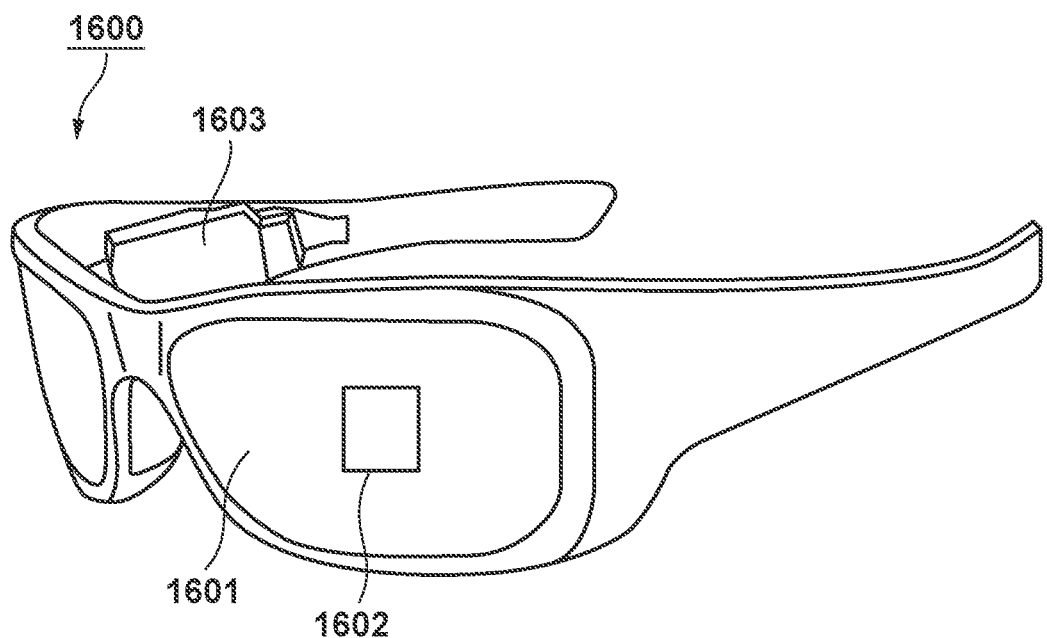
FIGS. 17A and 17B are views showing an example of a wearable device using the light emitting device according to the embodiment.
Figure 17B:
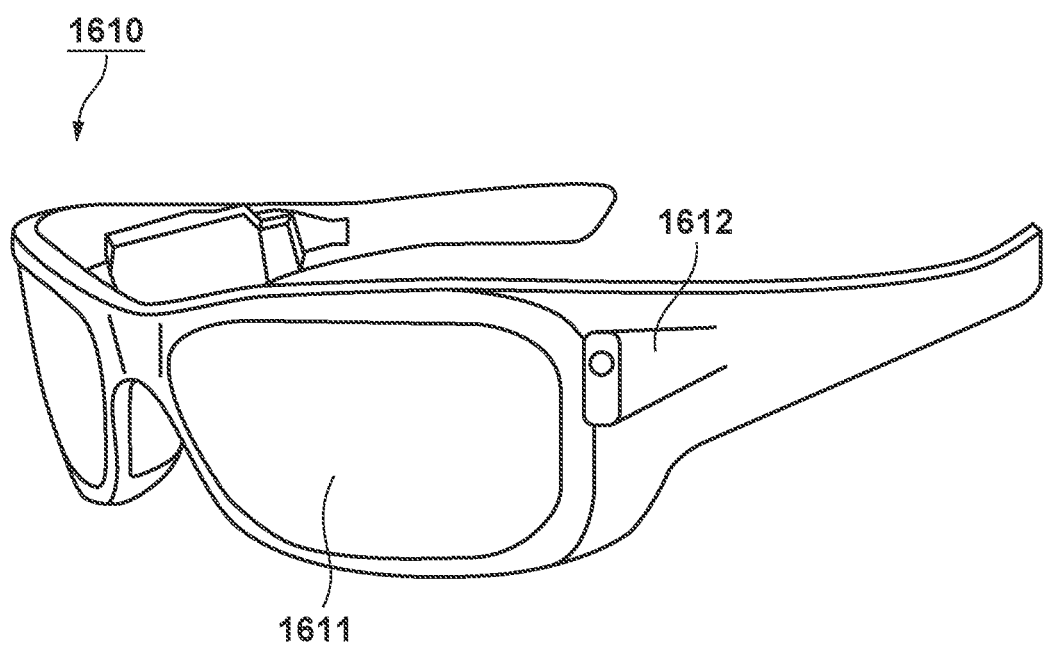

Further application examples of the light emitting device 100 according to this embodiment will be described with reference to FIGS. 17A and 17B. The light emitting device 100 can be applied to a system that can be worn as a wearable device such as smartglasses, an HMD (Head Mounted Display), or a smart contact lens. An image capturing display device used for such application examples can include an image capturing device capable of photoelectrically converting visible light and a light emitting device capable of emitting visible light.

Glasses 1600 (smartglasses) according to one application example will be described with reference to FIG. 17A. An image capturing device 1602 such as a CMOS sensor or an SPAD is provided on the surface side of a lens 1601 of the glasses 1600. In addition, the light emitting device 100 according to this embodiment is provided on the back surface side of the lens 1601.

The glasses 1600 further includes a control device 1603. The control device 1603 functions as a power supply that supplies electric power to the image capturing device 1602 and the light emitting device 100 according to each embodiment. In addition, the control device 1603 controls the operations of the image capturing device 1602 and the light emitting device 100. An optical system configured to condense light to the image capturing device 1602 is formed on the lens 1601.

Glasses 1610 (smartglasses) according to one application example will be described with reference to FIG. 17B. The glasses 1610 includes a control device 1612, and an image capturing device corresponding to the image capturing device 1602 and the light emitting device 100 are mounted on the control device 1612. The image capturing device in the control device 1612 and an optical system configured to project light emitted from the light emitting device 100 are formed in a lens 1611, and an image is projected to the lens 1611. The control device 1612 functions as a power supply that supplies electric power to the image capturing device and the light emitting device 100, and controls the operations of the image capturing device and the light emitting device 100. The control device 1612 may include a line-of-sight detection unit that detects the line of sight of a wearer. The detection of a line of sight may be done using infrared rays. An infrared ray emitting unit emits infrared rays to an eyeball of the user who is gazing at a displayed image. An image capturing unit including a light receiving element detects reflected light of the emitted infrared rays from the eyeball, thereby obtaining a captured image of the eyeball. A reduction unit for reducing light from the infrared ray emitting unit to the display unit in a planar view is provided, thereby reducing deterioration of image quality.

The line of sight of the user to the displayed image is detected from the captured image of the eyeball obtained by capturing the infrared rays. An arbitrary known method can be applied to the line-of-sight detection using the captured image of the eyeball. As an example, a line-of-sight detection method based on a Purkinje image obtained by reflection of irradiation light by a cornea can be used.

More specifically, line-of-sight detection processing based on pupil center corneal reflection is performed. Using pupil center corneal reflection, a line-of-sight vector representing the direction (rotation angle) of the eyeball is calculated based on the image of the pupil and the Purkinje image included in the captured image of the eyeball, thereby detecting the line-of-sight of the user.

The light emitting device 100 according to the embodiment of the present invention can include an image capturing device including a light receiving element, and control a displayed image based on the line-of-sight information of the user from the image capturing device.

More specifically, the light emitting device 100 decides a first visual field region at which the user is gazing and a second visual field region other than the first visual field region based on the line-of-sight information. The first visual field region and the second visual field region may be decided by the control device of the light emitting device 100, or those decided by an external control device may be received. In the display region of the light emitting device 100, the display resolution of the first visual field region may be controlled to be higher than the display resolution of the second visual field region. That is, the resolution of the second visual field region may be lower than that of the first visual field region.

In addition, the display region includes a first display region and a second display region different from the first display region, and a region of higher priority is decided from the first display region and the second display region based on line-of-sight information. The first display region and the second display region may be decided by the control device of the light emitting device 100, or those decided by an external control device may be received. The resolution of the region of higher priority may be controlled to be higher than the resolution of the region other than the region of higher priority. That is, the resolution of the region of relatively low priority may be low.

Note that AI may be used to decide the first visual field region or the region of higher priority. The AI may be a model configured to estimate the angle of the line of sight and the distance to a target ahead the line of sight from the image of the eyeball using the image of the eyeball and the direction of actual viewing of the eyeball in the image as supervised data. The AI program may be held by the light emitting device 100, the image capturing device, or an external device. If the external device holds the AI program, it is transmitted to the light emitting device 100 via communication.

When performing display control based on line-of-sight detection, smartglasses further including an image capturing device configured to capture the outside can be applied. The smartglasses can display captured outside information in real time.

According to the present invention, it is possible to provide a technique advantageous in improving the light emission efficiency and the color purity of a light emitting device.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-166498, filed Oct. 8, 2021, which is hereby incorporated by reference herein in its entirety.

What is claimed is:

1. A light emitting device in which a plurality of light emitting elements are arranged on a main surface of a substrate,
wherein each of the plurality of light emitting elements comprises a light emitting layer, a reflective layer arranged between the light emitting layer and the main surface of the substrate and configured to reflect light generated by the light emitting layer, a first electrode arranged between the reflective layer and the light emitting layer, an optical distance adjustment layer arranged between the reflective layer and the first electrode, an insulating layer covering a peripheral edge portion of the first electrode and arranged, between two light emitting elements adjacent to each other in the plurality of light emitting elements, between the optical distance adjustment layer and the light emitting layer, and a conductive plug extending from the insulating layer to pass through the optical distance adjustment layer and reach a height of an upper surface of the reflective layer while being in electrical contact with the first electrode.

2. The device according to claim 1, wherein
the conductive plug comprises a first surface arranged on a side of the reflective layer, and a second surface arranged in the insulating layer, and extends in a direction orthogonal to the main surface to connect the first surface and the second surface, and
in an orthogonal projection to the main surface, the first surface overlaps the second surface.

3. The device according to claim 2, wherein the second surface is arranged at a position farther apart from the main surface than the first electrode of any light emitting element of the plurality of light emitting elements.

4. The device according to claim 1, wherein in each of the plurality of light emitting elements, a microlens is arranged at a position farther apart from the main surface than the light emitting layer.

5. The device according to claim 4, wherein
the plurality of light emitting elements comprise a first light emitting element, and a second light emitting element arranged at a position closer to an outer edge of a display region with the plurality of light emitting elements arranged than the first light emitting element, and
in an orthogonal projection to the main surface, a distance between a center of the first electrode of the second light emitting element and a center of the microlens corresponding to the second light emitting element is longer than a distance between the center of the first electrode of the first light emitting element and the center of the microlens corresponding to the first light emitting element.

6. The device according to claim 5, wherein in the second light emitting element, the center of the microlens corresponding to the second light emitting element is shifted from the center of the first electrode in a direction from a center of the display region to the outer edge of the display region.

7. The device according to claim 5, wherein in each of the plurality of light emitting elements, the distance between the center of the first electrode and the center of the corresponding microlens in the orthogonal projection to the main surface increases continuously or stepwise from a center of the display region to the outer edge of the display region.

8. The device according to claim 5, wherein
in each of the plurality of light emitting elements, a color filter is further arranged between the microlens and the light emitting layer, and
in the orthogonal projection to the main surface, a distance between the center of the first electrode of the second light emitting element and a center of the color filter corresponding to the second light emitting element is longer than a distance between the center of the first electrode of the first light emitting element and the center of the color filter corresponding to the first light emitting element.

9. The device according to claim 8, wherein in the second light emitting element, the center of the color filter corresponding to the second light emitting element is shifted from the center of the first electrode in the direction from the center of the display region to the outer edge of the display region.

10. The device according to claim 8, wherein in each of the plurality of light emitting elements, the distance between the center of the first electrode and the center of the corresponding color filter in the orthogonal projection to the main surface increases continuously or stepwise from a center of the display region to the outer edge of the display region.

11. The device according to claim 8, wherein in each of the plurality of light emitting elements, the distance between the center of the first electrode and the center of the corresponding color filter in the orthogonal projection to the main surface is not more than the distance between the center of the first electrode and the center of the corresponding microlens in the orthogonal projection to the main surface.

12. The device according to claim 1, wherein in an orthogonal projection to the main surface, the conductive plug is in contact with the first electrode at a portion of the first electrode close to a center of a display region with the plurality of light emitting elements arranged.

13. The device according to claim 1, wherein
the plurality of light emitting elements comprise a third light emitting element, a fourth light emitting element, and a fifth light emitting element, whose reflective layers and first electrodes have distances different from each other,
the optical distance adjustment layer comprises a first layer, a second layer, and a third layer,
in the third light emitting element, the first layer is arranged between the reflective layer and the first electrode, and the second layer and the third layer are arranged between the peripheral edge portion and the insulating layer,
in the fourth light emitting element, the first layer and the second layer are arranged between the reflective layer and the first electrode, and the third layer is arranged between the peripheral edge portion and the insulating layer, and
in the fifth light emitting element, the first layer, the second layer, and the third layer are arranged between the reflective layer and the first electrode.

14. An image forming device comprising a photosensitive member, an exposure light source configured to expose the photosensitive member, a developing device configured to apply a developing agent to the exposed photosensitive member, and a transfer device configured to transfer an image developed by the developing device to a print medium,
wherein the exposure light source comprises the light emitting device according to claim 1.

15. The device according to claim 14, wherein a plurality of light emitting elements are arranged along a longitudinal direction of a substrate.

16. A photoelectric conversion device comprising an optical unit including a plurality of lenses, an image sensor configured to receive light having passed through the optical unit, and a display unit configured to display an image,
wherein the display unit displays an image captured by the image sensor, and comprises the light emitting device according to claim 1.

17. An electronic apparatus comprising a housing provided with a display unit, and a communication unit provided in the housing and configured to perform external communication,
wherein the display unit comprises the light emitting device according to claim 1.

18. An illumination device comprising a light source, and at least one of a light diffusing unit and an optical film,
wherein the light source comprises the light emitting device according to claim 1.

19. A moving body comprising a main body, and a lighting appliance provided in the main body,
wherein the lighting appliance comprises the light emitting device according to claim 1.

20. A method of manufacturing a light emitting device in which a plurality of light emitting elements including a light emitting layer are arranged on a substrate, comprising:
forming, on the substrate, a reflective layer corresponding to each of the plurality of light emitting elements and configured to reflect light generated by the light emitting layer;
forming an optical distance adjustment layer on the reflective layer, and in or on the optical distance adjustment layer, a first electrode corresponding to each of the plurality of light emitting elements and configured to transmit the light generated by the light emitting layer;
forming an insulating layer to cover the optical distance adjustment layer and the first electrode;
forming a contact hole extending from the insulating layer to pass through the optical distance adjustment layer and reach a height of an upper surface of the reflective layer while exposing a part of the first electrode and forming a conductive plug in the contact hole; and
exposing a portion of the first electrode different from the part and forming the light emitting layer in contact with the portion.

* * * * *